US008822040B2

(12) United States Patent  
Mori et al.

(10) Patent No.: US 8,822,040 B2  
(45) Date of Patent: Sep. 2, 2014

(54) ORGANIC ELECTROLUMINESCENT ELEMENT

(75) Inventors: Toshitaka Mori, Tokyo (JP); Yasuyuki Ohyagi, Tokyo (JP); Junji Kido, Yamagata (JP)

(73) Assignees: Dai Nippon Printing Co., Ltd., Tokyo-to (JP); KIDO, Junji, Yamagata (JP)

( * ) Notice: Subject to any disclaimer, the term of this patent is extended or adjusted under 35 U.S.C. 154(b) by 0 days.

(21) Appl. No.: 12/257,599

(22) Filed: Oct. 24, 2008

(65) Prior Publication Data

US 2009/0051279 A1 Feb. 26, 2009

Related U.S. Application Data

(62) Division of application No. 11/065,940, filed on Feb. 25, 2005, now abandoned.

(30) Foreign Application Priority Data

Feb. 26, 2004 (JP) .................................. 2004-051288

(51) Int. Cl.
*H01L 51/54* (2006.01)
*H01L 51/52* (2006.01)
*H01L 51/50* (2006.01)

(52) U.S. Cl.
CPC ......... *H01L 51/5221* (2013.01); *H01L 51/5206* (2013.01); *H01L 51/5092* (2013.01); *Y10S 428/917* (2013.01)
USPC ........... 428/690; 428/917; 313/504; 313/506; 252/301.16; 257/40

(58) Field of Classification Search
None
See application file for complete search history.

(56) References Cited

U.S. PATENT DOCUMENTS

| | | | | |
|---|---|---|---|---|
| 5,409,783 A * | 4/1995 | Tang et al. ..................... | 428/690 |
| 5,714,838 A | 2/1998 | Haight et al. | |
| 5,969,474 A * | 10/1999 | Arai ................................ | 313/504 |
| 6,020,243 A * | 2/2000 | Wallace et al. ................ | 438/287 |
| 6,284,393 B1 * | 9/2001 | Hosokawa et al. ............ | 428/690 |
| 6,356,032 B1 | 3/2002 | Suzuki et al. | |
| 6,433,355 B1 * | 8/2002 | Riess et al. ..................... | 257/40 |
| 6,437,374 B1 | 8/2002 | Northrup et al. | |
| 6,472,817 B1 | 10/2002 | Kawase | |
| 6,495,862 B1 | 12/2002 | Okazaki et al. | |
| 6,525,466 B1 | 2/2003 | Jabbour et al. | |
| 6,551,725 B2 * | 4/2003 | Raychaudhuri et al. ...... | 428/690 |
| 2001/0009351 A1 | 7/2001 | Hosokawa et al. | |
| 2001/0030507 A1 | 10/2001 | Ono | |
| 2002/0155319 A1 | 10/2002 | Kawamura et al. | |
| 2002/0180349 A1 * | 12/2002 | Aziz et al. ..................... | 313/506 |
| 2003/0044643 A1 | 3/2003 | Arakane et al. | |
| 2003/0218418 A9 * | 11/2003 | Sato et al. ..................... | 313/504 |
| 2004/0075382 A1 * | 4/2004 | Stegamat et al. ............. | 313/506 |
| 2008/0113101 A1 * | 5/2008 | Inoue et al. ................... | 427/384 |

FOREIGN PATENT DOCUMENTS

| | | |
|---|---|---|
| EP | 0 856 896 A1 | 8/1998 |
| EP | 1 237 208 A2 | 9/2002 |
| GB | 2 404 284 A | 1/2005 |
| JP | 10-125469 A | 5/1998 |
| JP | 10-144957 A | 5/1998 |
| JP | 10-162959 A | 6/1998 |
| JP | 10-223377 A | 8/1998 |
| JP | 2000-215984 A | 8/2000 |
| JP | 2000-243567 A | 9/2000 |
| JP | 20020-075658 A | 3/2002 |
| WO | 98/07202 A1 | 2/1998 |

OTHER PUBLICATIONS

8886 GCSE, Resistivity Reference, http://www.8886.co.uk/ref/resistivity_values.htm.*
Samarin et al., Solid State Communications, (2004), vol. 129, pp. 389-393.*
Lazicki et al., Physical Review B, (2008), vol. 78, 155133.*
Search Report: Application No. GB0503816.1 (filed in Parent U.S. Appl. No. 11/065,940.
USPTO Office Action mailed Jan. 23, 2009 for Parent U.S. Appl. No. 11/065,940.
USPTO Office Action mailed Sep. 29, 2009 for Parent U.S. Appl. No. 11/065,940.
USPTO Office Action mailed May 14, 2010 for parent U.S. Appl. No. 11/065,940.
USPTO OA mailed Feb. 1, 2011 in connection with U.S. Appl. No. 11/065,940.
Web Elements-Calcium, University of Sheffield, http://www.webelements.com/calcium/physics.html.
USPTO-OA mailed Apr. 8, 2008 for U.S. Appl. No. 11/065,940.
USPTO FOA mailed Dec. 6, 2011 in connection with U.S. Appl. No. 11/065,940.
CRC, Handbook of Chemistry and Physics, (2011-2012), $92^{nd}$ Edition, Section 12 p. 124.
USPTO NFOA mailed Aug. 16, 2012 in connection with U.S. Appl. No. 11/065,940.
USPTO FOA dated Mar. 1, 2013 in connection with U.S. Appl. No. 11/065,940.
USPTO AA dated Aug. 14, 2013 in connection with U.S. Appl. No. 11/065,940.

* cited by examiner

*Primary Examiner* — Michael H Wilson
(74) *Attorney, Agent, or Firm* — Ladas & Parry LLP

(57) ABSTRACT

A main object of the present invention is to provide an organic EL element which can ease damages of an organic EL layer upon formation of an electrode layer, and enables display of a high quality image. The present invention attains the above object by providing an organic electroluminescent element comprising: a substrate; a first electrode layer formed on the substrate; an organic electroluminescent layer which is formed on the first electrode layer, and has at least a light emitting layer; a semiconductor buffer layer which is formed on the organic electroluminescent layer, and contains an inorganic compound having a band gap of 2.0 eV or more and a metal; and a second electrode layer formed on the semiconductor buffer layer.

14 Claims, 3 Drawing Sheets

ORGANIC ELECTROLUMINESCENT ELEMENT

BACKGROUND OF THE INVENTION

1. Field of the Invention

The present invention relates to an organic electroluminescent (herein after, may be abbreviated as organic EL) element.

2. Description of the Related Art

The organic EL element has an advantage that visibility is high due to self light emission, impact resistance is excellent, different from a liquid crystal display, due to a wholly solid display, a response rate is rapid, scarcely influenced by a temperature change, and a visual angle is large. Utility as a light emitting element in an image displaying apparatus attracts attention.

The organic EL element has a fundamental construction of a laminated structure of anode/light emitting layer/cathode, and a construction in which an anode as a transparent electrode is formed on a substrate such as a glass substrate is usually adopted. In this case, emitted light is taken out from the substrate side (anode side).

On the other hand, in recent years, an attempt has been made to take out emitted light from the cathode side by using a transparent electrode as the cathode, that is, to perform top side light emission. By realizing this top side light emission, when both of the cathode and the anode are transparent electrodes, it enables to form a transparent light emitting element as a whole, and double side light emission can be realized. In such the transparent light emitting element, since an arbitrary color can be adopted as a background color, a colored display, even when light is not emitted, becomes possible, and ornamentality is improved. In addition, when a color filter layer or a color converting layer is formed on a light emitting element, the color filter layer or the color converting layer can be arranged and laminated on the light emitting layer, as in conventional light emitting element of bottom side light emission, in the light emitting element capable of performing top side light emission. Further, in the light emitting element capable of performing top side light emission, light emission is not shielded by TFT (thin film transistor) of an active driving display, and a display having a high opening rate becomes possible.

As an example of an organic EL element in which top side light emission is made possible by adopting a transparent electrode as the cathode, Japanese Patent Application Laid-Open (JP-A) No. 10-162959 discloses an organic EL element in which an organic EL layer containing a light emitting layer lies between an anode and a cathode, the cathode consists of an electron injecting layer and a transparent electrode layer, and this electron injecting layer is arranged to be contact with the organic EL layer.

However, in the conventional organic EL element in which top side light emission or double side light emission is possible, the transparent electrode such as ITO is generally formed into a film by a sputtering method. And there arises a problem that, upon formation of the transparent electrode, the organic EL layer containing the light emitting layer, and the electron injecting layer or the hole injecting layer are shocked by sputtered particles, $Ar^+$ at sputtering, and an ionized electron, so that the light emitting property is deteriorated (reduction in current density, reduction in light emitting efficiency, leakage of current). Further, there is also a problem that, upon formation of the transparent electrode as the cathode, a highly reactive metal contained in the electron injecting layer is oxidized due to oxygen introduction or release of oxygen from a target, and deterioration in property of the organic EL layer and the electron injecting layer (reduction in current density property, reduction in light emitting efficiency, increase in dark spot) is caused. When there are these problems, a high quality image display cannot be obtained.

Therefore, in order to improve deterioration in light emitting property or deterioration in property of the organic EL layer or the electron injecting layer due to impact at formation of the cathode film, an attempt has been made to form a buffer layer or a barrier layer between the cathode and the organic EL layer. For example, JP-A No. 2002-75658 discloses an organic EL element using CuPu as a buffer layer for the purpose of preventing damage of an organic EL layer due to sputtering upon formation of a cathode film. In addition, JP-A No. 10-144957 discloses a method for preventing a short circuit of an organic EL element and deterioration in property by providing a Ca diffusion barrier layer between a cathode and an organic EL layer for preventing diffusion of materials constituting the cathode into the organic EL layer containing the light emitting layer. Further, JP-A No. 10-223377 and JP-A No. 2000-215984 disclose an organic EL element in which a semiconductor such as ZnSe, ZnS and CdS intervenes between a cathode and an organic EL layer to improve electron transport from the cathode. In addition, JP-A No. 10-125469 discloses an organic EL element in which an conductive material layer such as Ag, Mg and TiN intervenes between a cathode and an organic EL layer containing a light emitting layer to reduce a resistance of the cathode.

However, when the aforementioned buffer layer or barrier layer (organic substance, semiconductor etc.) is inserted, in particular, in an organic EL element which is driven under a high current density (organic EL element using a conductive polymer), there is a problem that current density-voltage property is deteriorated as compared with the conventional organic EL element which takes emitted light out from the bottom side.

SUMMARY OF THE INVENTION

The present invention was done in view of the aforementioned problems, and a main object of the present invention is to provide an organic EL element which can ease damages of an organic EL layer upon formation of an electrode layer, and enables display of a high quality image.

In order to attain the aforementioned object, the present invention provides an organic electroluminescent element comprising: a substrate; a first electrode layer formed on the substrate; an organic electroluminescent layer which is formed on the first electrode layer, and has at least a light emitting layer; a semiconductor buffer layer which is formed on the organic electroluminescent layer, and contains an inorganic compound having a band gap of 2.0 eV or more and a metal; and a second electrode layer formed on the semiconductor buffer layer.

In the present invention, since the semiconductor buffer layer is formed between the organic EL layer and the second electrode layer, impact due to a sputtered particle, a plasma gas ion at sputtering, and an ionized electron at formation of the second electrode layer can be alleviated, and property deterioration of the organic EL layer and light emitting property deterioration of the organic EL element can be prevented. In addition, since the semiconductor buffer layer contains an inorganic compound and a metal, and an electric resistivity of this metal is lower as compared with the inorganic compound, deterioration in current density-voltage property can be prevented. Thereby, an organic EL element which enables high quality image display can be obtained.

Also, the present invention provides an organic electroluminescent element comprising: a substrate; an electrode layer formed on the substrate; an organic electroluminescent layer which is formed on the electrode layer and has at least a light emitting layer; and a semiconductor electrode layer which is formed on the organic electroluminescent layer and contains an organic compound having a band gap of 2.0 eV or more and a metal.

In the present invention, since the semiconductor electrode layer is formed into a film, for example, by a vacuum deposition method, the organic EL layer does not undergo impact at formation of the semiconductor electrode layer, and light emitting property deterioration of the organic EL element can be avoided. In addition, in the vacuum deposition method, since oxygen is not usually introduced, for example, even when an electron injecting layer is formed between the light emitting layer and the semiconductor electrode layer, oxidation of the metal contained in this electron injecting layer can be avoided.

In addition, in the present invention, the semiconductor buffer layer or the semiconductor electrode layer may be a mixed semiconductor layer in which the metal is dispersed in the inorganic compound.

Further, in the present invention, the semiconductor buffer layer comprises: an inorganic layer comprising the inorganic compound; and a metal layer comprising the metal, and the metal layer may be formed in the inorganic layer, or between the inorganic layer and the second electrode layer. On the other hand, the semiconductor electrode layer comprises: an inorganic layer comprising the inorganic compound; and a metal layer comprising the metal, and the metal layer may be formed in the inorganic layer, or on an opposite side to a side on which the organic electroluminescent layer is formed.

In addition, in the present invention, the semiconductor buffer layer or the semiconductor electrode layer may comprise: a mixed semiconductor layer in which the metal is dispersed in the inorganic compound; and an inorganic layer comprising the inorganic compound. In addition, the semiconductor buffer layer or the semiconductor electrode layer may comprise: a mixed semiconductor layer in which the metal is dispersed in the inorganic compound; and a metal layer comprising the metal.

Further, in the present invention, it is preferable that an electric resistivity $\rho$ of the metal is less than $1\times10^{-5}$ $\Omega\cdot cm$. This is because an electrical conductivity of the semiconductor buffer layer or the semiconductor electrode layer can be enhanced when the electric resistivity of the metal is in the aforementioned range.

In addition, in the present invention, it is preferable that work function of a metal contained in the semiconductor electrode layer is 4.2 eV or more.

Further, in the present invention, the inorganic compound may be an inorganic semiconductor compound. Thereupon, it is preferable that the inorganic semiconductor compound is a compound containing at least one kind of element selected from elements of Group 12 to Group 16 in 18 Group-type Element Periodic Table. This is because such the compound has a great band gap and is transparent.

In addition, in the present invention, the inorganic compound may be a metal compound containing at least one kind of element selected from elements of Group 17 in 18 Group-type Element Periodic Table.

Further, in the present invention, it is preferable that the semiconductor buffer layer or the semiconductor electrode layer has a thickness in a range of 1 nm to 500 nm, and an average light transmittance in a visible region is 30% or more. This is because there is a possibility that the light transmittance is lowered when the thickness of the semiconductor buffer layer or the semiconductor electrode layer is too thick. Conversely, when the thickness of the semiconductor buffer layer is too thin, there is a possibility that effect of protecting the organic EL layer from impact, at formation of the second electrode layer, is not obtained. And also, when the thickness of the semiconductor electrode layer is too thin, there is a possibility that the layer does not perform a function as an electrode.

In addition, in the present invention, it is preferable that a content of the metal in the semiconductor buffer layer or the semiconductor electrode layer is in a range of 0.0001% by volume to 90% by volume. When the content of the metal is too much, there is a possibility that the light transmittance of the semiconductor buffer layer or the semiconductor electrode layer is lowered. Conversely, when the content of the metal is too little, there is a possibility that effect of enhancing electrical conductivity of the semiconductor buffer layer or the semiconductor electrode layer is not obtained.

Further, in the present invention, it is preferable that, the metal is contained in the semiconductor buffer layer or the semiconductor electrode layer so that, when a metal contained in the semiconductor buffer layer or the semiconductor electrode layer is formed into a layer consisting only of the metal, a thickness of the layer consisting only of the metal is 100 nm or less. When the thickness of the layer consisting only of the metal is too thick, there is a possibility that the light transmittance of the semiconductor buffer layer or the semiconductor electrode layer is reduced.

In addition, in the present invention, it is preferable the semiconductor buffer layer or the semiconductor electrode layer is formed into a film by a vacuum deposition method. In the vacuum deposition method, since oxygen is not usually introduced, for example, even when the electron injecting layer is formed between the light emitting layer and the semiconductor buffer layer or the semiconductor electrode layer, oxidation of the metal contained in this electron injecting layer can be avoided.

Further, in the present invention, a charge injecting/transporting layer may be formed between the light emitting layer, and the semiconductor buffer layer or the semiconductor electrode layer. This is because this can stabilize injection of a charge into the light emitting layer, and enhance the light emitting efficiency.

In the present invention, since the semiconductor buffer layer is formed between the organic EL layer and the second electrode layer, damage of the organic EL layer due to impact at formation of the second electrode layer can be alleviated. In addition, for example, even when the electron injecting layer is formed between the light emitting layer and the semiconductor buffer layer, oxidation of the metal contained in this electron injecting layer can be prevented. As described above, in the present invention, such effect can be exerted that property deterioration of the organic EL layer and light emitting property deterioration of the organic EL element can be suppressed.

DETAILED DESCRIPTION OF THE INVENTION

The organic EL element of the present invention will be explained in detail below.

The organic EL element of the present invention can be classified into two embodiments based on a construction of the organic EL element. A first embodiment of the organic EL element of the present invention is characterized in comprising: a substrate; a first electrode layer formed on the substrate; an organic electroluminescent layer which is formed on the first electrode layer, and has at least a light emitting layer; a semiconductor buffer layer which is formed on the organic electroluminescent layer, and contains an inorganic compound having a band gap of 2.0 eV or more and a metal; and a second electrode layer formed on the semiconductor buffer layer. In addition, a second embodiment of the organic EL element of the present invention is characterized in comprising: a substrate; an electrode layer formed on the substrate; an organic electroluminescent layer which is formed on the electrode layer and has at least a light emitting layer; and a semiconductor electrode layer which is formed on the organic electroluminescent layer and contains an organic compound having a band gap of 2.0 eV or more and a metal. Each embodiment will be explained below.

1. FIRST EMBODIMENT

The first embodiment of the organic EL element of the present invention is characterized in comprising: a substrate; a first electrode layer formed on the substrate; an organic electroluminescent layer which is formed on the first electrode layer, and has at least a light emitting layer; a semiconductor buffer layer which is formed on the organic electroluminescent layer, and contains an inorganic compound having a band gap of 2.0 eV or more and a metal; and a second electrode layer formed on the semiconductor buffer layer.

Figure 1:
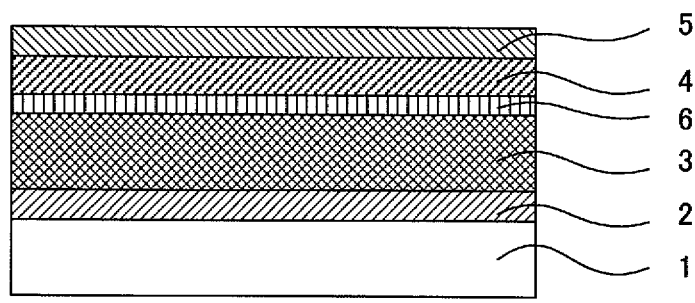
FIG. 1 is a schematic cross-sectional view showing one example of the organic EL element of the present invention.

The organic EL element of the present embodiment will be explained by referring to the drawings. FIG. 1 is a schematic cross-sectional view showing one example of the organic EL element of the present embodiment. In FIG. 1, an organic EL element comprises: a substrate 1; a first electrode layer 2 formed on the substrate 1; an organic EL layer 3 which is formed on the first electrode layer 2 and has at least a light emitting layer; an electron injecting layer 6 formed on the organic EL layer 3; a semiconductor buffer layer 4 formed on the electron injecting layer 6; and a second electrode layer 5 formed on the semiconductor buffer layer 4.

Conventionally, for example, the electrode layer is formed into a film on the organic EL layer by sputtering and, since the organic EL layer undergoes impact due to $Ar^+$, a sputtered particle and an ionized electron having a high energy amount at a few hundred volt, there is a disadvantage that a structure of the organic EL layer is changed, and radiationless quenching is caused at an interface between the organic EL layer and the electrode layer at charge injection, leading to light emitting property deterioration. In addition, for example, when the electron injecting layer containing an alkali metal or an alkaline earth metal is formed between the light emitting layer and the semiconductor buffer layer, since these metals are easily oxidized, there is a possibility that the metal is oxidized by oxygen introduction or release of oxygen from a target, at sputtering in formation of the electrode layer, and charge injecting function is lost. On the other hand, in the present embodiment, since the semiconductor buffer layer is formed between the organic EL layer and the second electrode layer, even when the second electrode layer is formed into a film by sputtering, impact to the organic EL layer due to plasma gas ions, the sputtered particles and the ionized electrons at sputtering can be alleviated. Therefore, property deterioration of the organic EL layer and light emitting property deterioration of the organic EL element can be prevented. In addition, for example, when the electron injecting layer is formed between the light emitting layer and the semiconductor buffer layer, since the electron injecting layer is protected by the semiconductor buffer layer, oxidation of the metal contained in the electron injecting layer can be prevented. Thereby, the light emitting efficiency and durability of the organic EL element can be improved, and the organic EL element capable of performing display of a high quality image can be obtained.

In addition, since the inorganic compound is generally of not low in electric resistivity, when a layer consisting only of the inorganic compound is formed between the organic EL layer and the second electrode layer, there is a disadvantage that a current density under high voltage (high current density region) is not increased, and a brightness is not improved. On the other hand, since the semiconductor buffer layer used in the present embodiment contains the inorganic compound and the metal, and the electric resistivity of this metal is lower as compared with the inorganic compound, reduction in current density-voltage property can be prevented. Thereby, for example, it can be suitably used in the organic EL element which is driven under high current density (organic EL element using an electrically conductive polymer).

Each essential component of such the organic EL element will be explained below.

(1) Semiconductor Buffer Layer

First, the semiconductor buffer layer used in the present embodiment will be explained. The semiconductor buffer layer used in the present embodiment is formed between the organic EL layer and the second electrode layer, and contains an inorganic compound having a band gap of 2.0 eV or more and the metal.

A semiconductor buffer layer in the present embodiment has two functions of function of protecting the organic EL layer at formation of the second electrode layer, and function of transporting and injecting a charge into the organic EL layer as described above. In addition, when a charge injecting/transporting layer is formed between the semiconductor buffer layer and the light emitting layer, the semiconductor buffer layer also has function of protecting the charge injecting/transporting layer, and function of transporting and injecting a charge to the charge injecting/transporting layer. In the present embodiment, by forming the semiconductor buffer layer between the organic EL layer and the second electrode layer, impact to the organic EL layer at formation of the second electrode layer can be alleviated. In addition, when the electron injecting layer is formed between the light emitting layer and the semiconductor buffer layer, oxidation of the metal contained in this electron injecting layer can be prevented. Further, by inclusion of the metal in the semiconductor buffer layer, reduction in current density-voltage property can be suppressed. Thereby, the light emitting efficiency and durability of the organic EL element can be improved.

The semiconductor buffer layer used in the present embodiment can be classified into four aspects based on a construction of this semiconductor buffer layer. That is, they are: the case where the semiconductor buffer layer is a mixed semiconductor layer in which the metal is dispersed in the inorganic compound (first aspect); the case where the semiconductor buffer layer comprises an inorganic layer comprising an inorganic compound and a metal layer comprising a metal, and this metal layer is formed in the inorganic layer or between the inorganic layer and the second electrode layer (second aspect); the case where the semiconductor buffer layer comprises a mixed semiconductor layer in which a metal is dispersed in an inorganic compound, and an inorganic layer comprising an inorganic compound (third aspect); and the case where the semiconductor buffer layer comprises a mixed semiconductor layer in which a metal is dispersed in an inorganic compound, and a metal layer comprising a metal (forth aspect).

Each aspect of such the semiconductor buffer layer will be explained below.

(i) First Aspect

The first aspect of the semiconductor buffer layer used in the present embodiment is a mixed semiconductor layer in which a metal is dispersed in an inorganic compound. In the present aspect, since the metal is dispersed in the mixed semiconductor layer, an electric resistivity of the mixed semiconductor layer can be reduced, and reduction in current density-voltage property can be suppressed.

Materials constituting such the mixed semiconductor layer will be explained below.

(Inorganic Compound)

The inorganic compound used in the present aspect has its band gap of 2.0 eV or more. The inorganic compound used in the present aspect is not particularly limited as long as it can be formed into a layer having protecting function of alleviating impact to the organic EL layer or the charge injecting/transporting layer at formation of the second electrode layer as described above. In addition, the band gap of the inorganic compound may be 2.0 eV or more, preferably 2.4 eV or more, particularly preferably 2.6 eV or more. When the band gap of the inorganic compound is in the aforementioned range, the light transmittance, in a visual region, of the mixed semiconductor layer can be enhanced. In addition, when the band gap is too small, there is a possibility that a mixed semiconductor layer is colored, and the light transmittance in the visible region is reduced. On the other hand, an upper limit value of the band gap of the inorganic compound is not particularly limited because as the band gap gets larger, the light transmittance is increased. However, the value is usually 30 eV or less.

Examples of such the inorganic compound include an inorganic semiconductor compound having a prescribed band gap and an insulating compound having light permeability. In the present embodiment, among the above, it is preferable to use the inorganic semiconductor compound.

The inorganic semiconductor compound is not particularly limited as long as it can be formed into a layer having protecting function of alleviating impact to the organic EL layer or the charge injecting/transporting layer at formation of the second electrode layer as described above. In addition, the band gap of the inorganic semiconductor compound may be 2.0 eV or more, preferably 2.4 eV or more, particularly preferably 2.6 eV or more. When the band gap of the inorganic semiconductor compound is in the aforementioned range, the light transmittance of the mixed semiconductor layer in the visible region can be enhanced. In addition, when the band gap is too small, there is a possibility that the mixed semiconductor layer is colored, and the light transmittance in the visible region is lowered. On the other hand, an upper limit value of the band gap of the inorganic semiconductor compound is not particularly limited because as the band gap gets larger, light permeability is increased as descried above. However, the value is usually 8 eV or less.

Examples of such the inorganic semiconductor compound include compounds containing at least one kind of element selected from elements of Group 12 to Group 16 in 18 Group-type Element Periodic Table. Specific examples include ZnS, ZnSe, ZnTe, GaN, GaS, $Ga_2S_3$, GaP, GaSe, AlN, AlP, AlAs, AlSb, $Al_2Se_3$, BN, BP, BAs, CdS, HgS, SiC and the like. These compounds may be used alone, or two or more kinds may be used by mixing. In the present aspect, among the aforementioned compounds, it is preferable to use at least one kind of a compound selected from ZnS, ZnSe, GaN and GaS, and particularly, ZnS and ZnSe are preferable. This is because the aforementioned compounds have a large band gap, and are transparent.

In addition, the insulating compound having light permeability is not particularly limited as long as it can be formed into a layer having protecting function of alleviating impact to the organic EL layer or the charge injecting/transporting layer at formation of the second electrode layer. In addition, the band gap of the insulating compound may be 2.0 eV or more and, since insulating property is exhibited, 8 eV or more is usually used. An upper limit value of the band gap of the insulating compound is not particularly limited because as the band gap gets larger, light permeability is increased as described above. However, the values is usually 30 eV or smaller. When the band gap of the insulating compound is in the aforementioned range, the light transmittance of the mixed semiconductor layer in the visible region can be enhanced.

Examples of such the insulating compound include metal compounds containing at least one kind of element selected from elements of Group 17 in 18 Group-type Element Periodic Table. Specific examples include fluoride, chloride, bromide and iodide of an alkali metal, an alkaline earth metal, a rare earth element and a transition element and the like. Further specific examples include LiF, NaF, KF, $MgF_2$, $CaF_2$, $BaF_2$, $LaF_3$, $AlF_3$, $ZnF_2$, $CuF_2$, LiCl, RbCl, $MgCl_2$, $BeCl_2$, NaBr, GeBr, NaI, KI and the like. These compounds may be used alone, or two or more kinds may be used by mixing. In the present embodiment, among the above, it is preferable to use fluoride of an alkali metal, an alkaline earth metal, a rare earth element and a transition element, and it is particularly preferable to use LiF, $MgF_2$ or $CaF_2$.

(Metal)

The metal used in the present aspect is not particularly limited as long as it has function of transporting and injecting the charge to the organic EL layer as described above, and the electric resistivity $\rho$ is preferably less than $1\times10^{-5}$ $\Omega\cdot cm$, among the above, $3\times10^{-6}$ $\Omega\cdot cm$ or less, particularly preferably $1\times10^{-6}$ $\Omega\cdot cm$. When the electric resistivity of the metal is in the aforementioned range, electric conductivity of the mixed semiconductor layer can be enhanced.

Examples of such the metal include, for example, an alkali metal (Li, Na, K, Rb, Cs, Fr), an alkaline earth metal (Be, Mg, Ca, Sr, Ba, Ra), a transition metal (Cu, Ag, Au, Cr, Fe, Mo, Mn, Ni, Ta, W, Pt, Ti, Os), a rare earth metal (Sc, Y, Eu, Er, Yb), and Al, Ga, In, Zn and the like. These metals may be used alone, or two or more kinds may be used jointly. In the present aspect, among the above metals, it is preferable to use an alkali metal, an alkaline earth metal, Cu, Ag, Au or Al, and it is particularly preferable to use an alkali metal or an alkaline earth metal. If the alkali metal or the alkaline earth metal is used as the metal, for example, as described layer, since when the electron injecting layer is formed between the light emitting layer and the mixed semiconductor layer, this electron injecting layer is generally formed using the alkali metal or the alkaline earth metal, types of the material to be used for manufacturing the organic EL element can be decreased, and a manufacturing process becomes simple. In addition, for example, when the second electrode layer is a cathode, since the alkali metal or the alkaline earth metal has a small work function value, better electron injection can be performed by direct contact of these metals with the organic EL layer. On the other hand, when Cu. Ag, Au or Al is used as the metal, since these metals have a large work function such as 4.0 eV or more, when the second electrode layer is an anode, a hole injected from this second electrode layer can be stably injected into the light emitting layer.

In addition, in the present aspect, the metal is not particularly limited as long as it is dispersed in the mixed semiconductor layer, and the metal may be dispersed uniformly, or may be dispersed ununiformly. In particular, when the metal is an alkali metal or an alkaline earth metal, it is preferable that the metal is present on the organic EL layer side at a large amount, and little metal is present on the second electrode layer side. Since the alkali metal and the alkaline earth metal are the metal having high reactivity, they are easily oxidized and, when the alkali metal and the alkaline earth metal are present on the second electrode layer side in a large amount, there is a possibility that the metal is easily oxidized by oxygen introduction or release of an oxygen from a target at formation of the second electrode layer, and a current density or brightness property of the organic EL element is deteriorated.

A content of the metal, in the mixed semiconductor layer, can be set in a range of usually 0.0001% by volume to 90% by volume, preferably 0.01% by volume to 60% by volume, among the above, 0.1% by volume to 50% by volume, particularly preferably 1% by volume to 20% by volume. When the content of the metal is too large, there is a possibility that the light transmittance of the mixed semiconductor layer is reduced. Conversely, when the content of the metal is too small, there is a possibility that effect of enhancing electric conductivity of the mixed semiconductor layer is not obtained.

The content of the metal can be measured using an X-ray photoelectron spectrometry (XPS) or Rutherford back scattering analysis method (RBS).

In addition, when a metal contained in the mixed semiconductor layer is formed into a layer consisting only of the metal, a thickness of the layer containing only of this metal is preferably 100 nm or less, among the above, in a range of 1 nm to 30 nm, further 1 nm to 20 nm, particularly preferably 1 nm to 10 nm. When the thickness of the layer consisting only of the metal is too thick, there is a possibility that the light transmittance of the mixed semiconductor layer is reduced. Conversely, when the thickness of the layer consisting only of the metal is too thin, there is a possibility that electric conductivity of the semiconductor buffer layer is reduced.

The thickness of the layer consisting only of the metal can be calculated from a content of the metal in the mixed semiconductor layer, and a volume and an area of the mixed semiconductor layer. In this case, the formula is as follows:

(thickness of the layer consisting only of the metal)=
(volume of the mixed semiconductor layer)×
(content of the metal)÷(area of the mixed semiconductor layer)

The thickness of the layer consisting only of the metal can be also calculated from a deposition rate and a deposition time upon deposition of a mixed semiconductor layer. For example, when the mixed semiconductor layer is co-deposited, the formula is as follows:

(thickness of the layer consisting only of the metal)=
(deposition rate of the metal)×(deposition time)

(Semiconductor Buffer Layer)

As the semiconductor buffer layer in the present aspect, it is preferable that an average light transmittance in a visible region 380 to 780 nm is 30% or more, among the above, more preferably 50% or more. Thereby, even when light is taken out from the second electrode layer side, light is not shielded. The average light transmittance is a value measured by using an ultra violet and visible spectrophotometer (UV-2200A, manufactured by Shimadzu Corporation), at room temperature in the atmosphere.

In addition, it is preferable that the electric resistivity of the semiconductor buffer layer is a value between an electric resistivity of the second electrode layer and the electric resistivity of an EL layer. Thereby, a charge injected from the second electrode layer can be effectively injected into the organic EL layer. Specifically, it is preferable that the electric resistivity of the semiconductor buffer layer is in a range of $1\times10^{-4}$ Ω·cm to $1\times10^{3}$ Ω·cm, among the above, $1\times10^{-4}$ Ω·cm to $1\times10^{2}$ Ω·cm, particularly $1\times10^{-4}$ Ω·cm to 10 Ω·cm. The electric resistivity is a value measured by a four probe method using Dia Instruments Loresta-GP (MCP-T600).

A thickness of the semiconductor buffer layer is not particularly limited as long as it is such a thickness that the average light transmittance and the electric resistivity are satisfied, specifically the thickness is preferably in a range of 1 nm to 500 nm, among the above, 1 nm to 100 nm, particularly preferably in a range of 10 nm to 50 nm. When the thickness of the semiconductor buffer layer is too thick, there is a possibility that the light transmittance is reduced. Conversely, when the thickness of the semiconductor buffer layer is too thin, there is a possibility that effect of protecting the organic EL layer or the charge injecting/transporting layer from impact at formation of the second electrode layer.

A method for forming the semiconductor buffer layer in the present aspect is not particularly limited as long as it is a method which does not influence the organic EL layer. For example, a vacuum deposition method, a high frequency sputtering method, a magnetron sputtering method, an ion beam sputtering method, an ion plating method and the like can be used and, among the above, it is preferable to use a vacuum deposition method. For example, even when the electron injecting layer is formed between the semiconductor buffer layer and the light emitting layer, since oxygen is not usually introduced in the vacuum deposition method, there is no possibility that the metal contained in the electron injecting layer is oxidized at formation of the semiconductor buffer layer. Examples of such the vacuum deposition method include a resistance heating deposition method, an electron beam deposition method, a flash deposition method and the like. In particular, a one source deposition method, a two sources deposition method or a three sources deposition method using the resistance heating deposition method or the electron beam deposition method is preferable. On the other hand, when a high frequency sputtering method, a magnetron sputtering method, an ion beam sputtering method, or ion plating method is used, it is preferable that oxygen is not introduced based on the aforementioned reasons. Thereupon, not oxygen, but a rare gas such as argon, or nitrogen and the like may be introduced, among the above, argon is preferably introduced.

(ii) Second Aspect

The second aspect of the semiconductor buffer layer used in the present embodiment comprises: an inorganic layer comprising the inorganic compound; and a metal layer comprising the metal, and this metal layer is formed in the inorganic layer, or between the inorganic layer and the second electrode layer. For example, in FIG. 2, a semiconductor buffer layer 4 has a construction that an inorganic layer 14a, a metal layer 14b and an inorganic layer 14a are laminated in this order. In the present aspect, because the semiconductor buffer layer comprises the metal layer comprising the metal, an electric resistivity of the semiconductor buffer layer, as a whole, can be reduced, and it becomes possible to suppress reduction in current density-voltage property.

Figure 2:
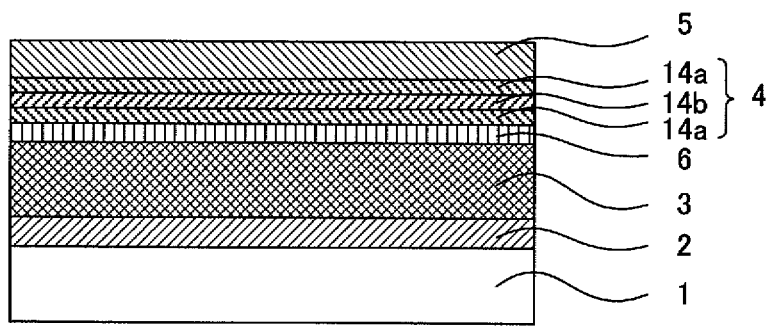
FIG. 2 is a schematic cross-sectional view showing other example of the organic EL element of the present invention.
Figure 3:
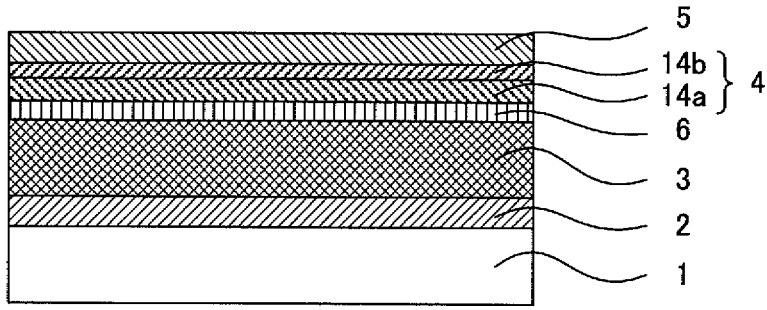
FIG. 3 is a schematic cross-sectional view showing other example of the organic EL element of the present invention.

As the forming position of the inorganic layer and the metal layer in the present aspect, for example, as shown in FIG. 2, a metal layer 14b is formed so as to be held by inorganic layers 14a and, as shown in FIG. 3, a metal layer 14b may be formed between an inorganic layer 14a and a second electrode layer 5. In addition, it is acceptable as long as the metal layer is not in contact with the organic EL layer. A plurality of metal layers and a plurality of inorganic layers may be laminated.

Each essential component of such the semiconductor buffer layer will be explained below.

(Inorganic Layer)

The inorganic layer used in the present aspect is a layer comprising the inorganic compound. In the present aspect, as the inorganic compound, an inorganic semiconductor compound having a prescribed band gap can be used. Since the inorganic semiconductor compound is the same as that described in the first aspect, the explanation is omitted herein.

A thickness of the inorganic layer is not particularly limited as long as it is such a thickness that, as the while semiconductor buffer layer, the organic EL layer can be protected from impact at formation of the second electrode layer. For example, when the metal layer 14b is held between inorganic layers 14a as shown in FIG. 2, since the metal layer 14b is formed so as not to be in contact with an organic EL layer 3 in the present aspect, the thickness of the inorganic layer 14a provided on the organic EL layer 3 side can be set at around 1 nm to 500 nm.

A method for forming the inorganic layer is not particularly limited as long as it is a method with does not influence the organic EL layer. For example, a vacuum deposition method, a high frequency sputtering method, a magnetron sputtering method, an ion beam sputtering method, an ion plating method and the like can be used. Among the above, it is preferable to use a vacuum deposition method. For example, even when the electron injecting layer is formed between the semiconductor buffer layer and the light emitting layer, since oxygen is not usually introduced in the vacuum deposition method, there is no possibility that a metal contained in an electron injecting layer is oxidized at formation of the inorganic layer. Examples of such the vacuum deposition method include a resistance heating deposition method, an electron beam deposition method, and an ion beam deposition method and the like. In particular, a one source deposition method, a two sources deposition method or a three sources deposition method using a resistance heating deposition method or an electron beam deposition method is preferable. On the other hand, when a high frequency sputtering method, a magnetron sputtering method, an ion beam sputtering method, or an ion plating method is used, it is preferable that oxygen is not introduced for the aforementioned reason. Thereupon, not oxygen, but a rare gas such as argon, or nitrogen and the like may be introduced, among the above, argon is preferably introduced.

(Metal Layer)

The metal layer used in the present aspect is a layer comprising the metal. The metal used in the metal layer is not particularly limited as long as it can reduce the electric resistivity of the semiconductor buffer layer as a whole, and it is preferable that the metal has an electric resistivity described in the first aspect.

In the present aspect, for example, when the metal layer 14b is held between the inorganic layers 14a as shown in FIG. 2, examples of the metal to be used include an alkali metal (Li, Na, K, Rb, Cs, Fr), an alkaline earth metal (Be, Mg, Ca, Sr, Ba, Ra), a transition metal (Cu, Ag, Au, Cr, Fe, Mo, Mn, Ni, Ta, W, Pt, Ti, Os), and a rate earth metal (Sc, Y, Eu, Er, Yb), and Al, Ga, In, Zn and the like. These metals may be used alone, or two or more kinds may be used jointly.

In addition, for example, when the metal layer 14b is formed between the inorganic layer 14a and the second electrode layer 5, as shown in FIG. 3, examples of a metal to be used include the aforementioned metals. Among the above, it is preferable to use the metal having work function of around 4.0 to 5.5 eV. Examples of such the metal include Ag, Au, Al, Cr, Cu, Fe, Mo, Mn, Ni, Ta, W and the like. These metals may be used alone, or two or more kinds may be used jointly. Since these metals have low reactivity, and are not likely to be oxidized by oxygen introduction or release of oxygen from a target at formation of the second electrode layer, durability of the organic EL element can be enhanced.

A thickness of the metal layer is preferably 100 nm or less, among the above, in a range of 1 nm to 30 nm, further 1 nm to 20 nm, particularly preferably 1 nm to 10 nm. When the thickness of the metal layer is too thick, there is a possibility that the light transmittance of the semiconductor buffer layer is reduced. Conversely, when the thickness of the metal layer is too thin, there is a possibility that electrical conductivity of the semiconductor buffer layer is reduced.

In addition, method for forming the metal layer is not particularly limited as long as it is a method which does not influence the organic EL layer. For example, a vacuum deposition method, a high frequency sputtering method, a magnetron sputtering method, an ion beam sputtering method, an ion plating method and the like can be used. Among the above, it is preferable to use a vacuum deposition method. For example, even when the electron injecting layer is formed between the semiconductor buffer layer and the light emitting layer, since oxygen is not usually introduced in the vacuum deposition method, there is no possibility that the metal contained in the electron injecting layer is oxidized at formation of the metal layer. Examples of such the vacuum deposition method include a resistance heating deposition method, an electron beam deposition method, an ion beam deposition method and the like. In particular, a one source deposition method, a two sources deposition method or a three sources deposition method using a resistance heating deposition method or an electron beam deposition method is preferable. When a high frequency sputtering method, a magnetron sputtering method, an ion beam sputtering method or an ion plating method is used, it is preferable that oxygen introduction is not performed for the aforementioned reason. Thereupon, not oxygen, but a rare gas such as argon, or nitrogen and the like may be introduced. Among the above, it is preferable to introduce argon.

Since other respects of the semiconductor buffer layer are the same as those described for the first aspect, explanation is not repeated herein.

(iii) Third Aspect

The third aspect of the semiconductor buffer layer used in the present embodiment comprises: a mixed semiconductor layer in which the metal is dispersed in the inorganic compound; and an inorganic layer comprising the inorganic compound. In the present aspect, since the mixed semiconductor layer constituting the semiconductor buffer layer is such that the metal is dispersed in the inorganic compound, it becomes possible to suppress reduction in current density-voltage property.

A forming position of the mixed semiconductor layer and the inorganic layer in the present aspect is not particularly limited. The mixed semiconductor layer and the inorganic layer mat be laminated in this order from the organic EL layer side, or the inorganic layer and the mixed semiconductor layer may be laminated in this order. Alternatively, a plurality of mixed semiconductor layers and a plurality of inorganic layers may be laminated.

Since other respects of t mixed semiconductor layer and the semiconductor buffer layer are the same as those described for the first aspect, and the inorganic layer is the same as that described for the second aspect, explanation is not repeated herein.

(iv) Forth Aspect

The forth aspect of the semiconductor buffer layer used in the present embodiment comprises: a mixed semiconductor layer in which the metal is dispersed in the inorganic compound; and a metal layer comprising the metal. In the present aspect, the mixed semiconductor layer constituting the semiconductor buffer layer is such that the metal is dispersed in the inorganic compound and, because the semiconductor buffer layer has the metal layer comprising the metal, the electric resistivity of the semiconductor buffer layer, as a whole, can be reduced, and it becomes possible to suppress reduction in current density-voltage property.

A forming position of the mixed semiconductor layer and the metal layer in the present aspect is not particularly limited. The mixed semiconductor layer and the metal layer may be laminated in this order from the organic EL layer side, or the metal layer and the mixed semiconductor layer may be laminated in this order. Alternatively, a plurality of mixed semiconductor layers and a plurality of metal layers may be laminated.

Each component of such the semiconductor buffer layer will be explained below. Since a mixed semiconductor layer is the same as that described for the first aspect, explanation is not repeated herein.

(Metal Layer)

The metal layer used in the present aspect is a layer comprising the metal. The metal used in the metal layer is not particularly limited as long as an electric resistivity of the semiconductor buffer layer as a whole can be reduced, and it is preferable that the metal layer has the electric resistivity described in the first aspect.

Examples of the metal used in the metal layer in the present aspect include an alkali metal (Li, Na, K, Rb, Cs, Fr), an alkaline earth metal (Be, Mg, Ca, Sr, Ba, Ra), a transition metal (Cu, Ag, Au, Cr, Fe, Mo, Mn, Ni, Ta, W, Pt, Ti, Os), a rare earth metal (Sc, Y, Eu, Er, Yb), and Al, Ga, In, Zn and the like. These metals may be used alone, or two or more kinds may be used jointly.

For example, when the metal layer is formed so as to be held by mixed semiconductor layers, the metal is preferably an alkali metal or an alkaline earth metal. For example, when the electron injecting layer is formed between the organic EL layer and the semiconductor buffer layer as described later, since this electron injecting layer is generally formed using an alkali metal or an alkaline earth metal, types of the materials to be used for manufacturing an organic EL element can be decreased, and a manufacturing process becomes simple.

In addition, for example, when a metal layer is formed so as to be in contact with the second electrode layer, it is preferable that, as the metal, a metal having work function of around 4.0 to 5.5 eV is used. Examples of such the metal include Ag, Au, Al, Cr, Cu, Fe, Mo, Mn, Ni, Ta, W and the like. These metals may be used alone, or two or more kinds may be used jointly. Since these metals have low reactivity, and they are less likely to be oxidized by oxygen introduction or release of oxygen from a target at formation of the second electrode layer, durability of the organic EL element can be enhanced.

Further, for example, when the metal layer is formed so as to be in contact with the organic EL layer, the preferable metal is different depending on a kind of the second electrode layer (anode, cathode) described later. When the second electrode layer is a cathode, it is preferable that the metal is an alkali metal or an alkaline earth metal. Thereby, the electron can be injected into the organic EL layer stably. In addition, when the electron injecting layer is formed between the organic EL layer and the semiconductor buffer layer as described above, since this electron injecting layer is generally formed using an alkali metal or an alkaline earth metal, types of materials used for manufacturing the organic EL element can be decreased, and a manufacturing process becomes simple. On the other hand, when the second electrode layer is an anode, it is preferable that the metal has work function of around 4.0 to 5.5 eV, and specifically, it is preferable to use Ag, Au, Al, Cr, Cu, Fe, Mo, Mn, Ni, Ta, W and the like. Thereby, a hole can be stably injected into the organic EL layer.

Since other respects of the metal layer are the same as those described in the second aspect, explanation is not repeated herein. Since other respects of the semiconductor buffer layer are the same as those described in the first aspect, explanation is not repeated here.

(v) Others

The semiconductor buffer layer in the present embodiment may be such that, in addition to the aforementioned components, the mixed semiconductor layer, the metal layer and the inorganic layer are laminated. In this case, a forming position of the mixed semiconductor layer, the metal layer and the inorganic layer is not particularly limited. Examples include the case where a mixed semiconductor layer, the metal layer and the inorganic layer are laminated in this order from the organic EL layer side, and the case where the inorganic layer, the mixed semiconductor layer and the metal layer are laminated in this order.

In addition, in the semiconductor buffer layer used in the present embodiment, those with the mixed semiconductor layer laminated thereon has higher electrical conductivity than those with the inorganic layer and the metal layer are laminated thereon, because the metal is diffused (present) throughout the semiconductor buffer layer.

(2) Organic EL Layer

Next, the organic EL layer used in the present embodiment will be explained. The organic EL layer used in the present embodiment is formed between the semiconductor buffer layer and the first electrode layer described later.

The organic EL layer in the present embodiment is constructed of the organic layer of one layer or a plurality of layers containing at least the light emitting layer. That is, the organic EL layer is a layer containing at least the light emitting layer, and refers to a layer construction of one or more organic layers. Usually, when the organic EL layer is formed by a wet method by coating, since it is difficult to laminate many layers concerning solvents, the organic EL layer is formed of one layer or two layers of organic layers in many cases, an organic material is devised so that solubility into a solvent is different, or further many layers may be formed by combining a vacuum deposition method.

Examples of the organic layer formed in the organic EL layer, other than the light emitting layer, include the charge injecting layer such as the hole injecting layer and the electron injecting layer. Further, examples of other organic layer include the charge transporting layer such as the hole transporting layer for transporting the hole to the light emitting layer, and the electron transporting layer for transporting the electron to the light emitting layer. Usually, they are formed by integration with the charge injecting layer in many cases, by imparting function of charge transportation to the charge injecting layer. Examples of other organic layer formed in the organic EL layer include a layer for enhancing a recombining efficiency, such as a career blocking layer, by preventing the hole or the electron from going through, and by preventing diffusion of an exciton to confine an exciton in the light emitting layer.

In such the organic EL layer, the light emitting layer which is an essential component will be explained below.

(i) Light Emitting Layer

The light emitting layer used in the present embodiment has function of emitting light by offering a place for the electron and the hole to be recombined. Examples of the material for forming the light emitting layer usually include a pigment-based light emitting material, a metal complex-based light emitting material, and a polymer-based light emitting material.

Examples of the pigment-based light emitting material include a cyclopentadiene derivative, a tetraphenylbutadiene derivative, a triphenylamine derivative, an oxadiazole derivative, a pyrazoloquinoline derivative, a distyrylbenzene derivative, a distyrylarylene derivative, a silole derivative, a thiophene ring compound, a pyridine ring compound, a perynone derivative, aperylene derivative, an oligothiophene derivative, a trifumanylamine derivative, a coumarin derivative, an oxadiazole dimer, and pyrazoline dimer.

In addition, examples of the metal complex-based light emitting material include a metal complex having Al, Zn, Be, Ir, Pt and the like, or a rare earth metal such as Tb, Eu and Dy in a central metal and having oxadiazole, thiaziazole, phenylpyridine, phenylbenzoimidazole or quinoline structure, in a legend, such as an aluminumquinolinol complex, a benzoquinolinolberyllium complex, a benzooxazole zinc complex, a benzothiazole zinc complex, an azomethyl zinc complex, a porphyrin zinc complex, europium complex, an iridium metal complex, a platinum metal complex and the like. Specifically, a tris(8-quinolinolato)aluminum complex (Alq3) can be used.

Further, examples of the polymer-based light emitting material include a polyparaphenylenevinylene derivative, a polythiophene derivative, a poylparaphenylene derivative, a polysilane derivative, a polyacetylene derivative, polyvinylcarbazole, a polyfluorenone derivative, a polyfluorene derivative, a polyquinoxaline derivative, a polydialkylfluorene derivative, and a copolymer thereof. In addition, examples include a polymer of the pigment-based light emitting material and the metal complex-based light emitting material.

Among the aforementioned materials, the light emitting material used in the present embodiment is preferably a metal complex-based light emitting material or a polymer-based light emitting material, further preferably a polymer-based light emitting material. Among polymer-based light emitting materials, an electrically conductive polymer having a π conjugated structure is preferable. Examples of such the electrically conductive polymer having a π conjugated structure include the aforementioned a polyparaphenylenevinylene derivative, a polythiophenel derivative, a polyparaphenylene derivative, a polysilane derivative, a polyacetylene derivative, a polyfluorenone derivative, a polyfluorene derivative, a polyquinoxaline derivative, a polydialkylfluorene compound, and a copolymer thereof.

A thickness of the light emitting layer is not particularly limited as long as it is such the thickness that can provide a place for the electron and the hole to be recombined, and can exhibit function of light emission. However, for example, the thickness can be around 1 nm to 200 nm.

In addition, a dopant which emits fluorescent light or phosphorescent light may be added to the light emitting layer for the purpose of improving a light emitting efficiency or changing a light emitting wavelength. Examples of such the dopant include a perylene derivative, a coumarin derivative, a rubrene derivative, a quinacridone derivative, a squarylium derivative, a porphyrin derivative, a styryl pigment, a tetracene derivative, a pyrazoline derivative, decacyclene, phenoxazone, a quinoxaline derivative, a carbazole derivative, and a fluorene derivative.

In the present embodiment, light emitting layers emitting different colors can be combined and, when a full color and multi color display is manufactured, patterning is necessary.

A method for forming the light emitting layer is not particularly limited as long as it is a method which enables highly precise patterning. Examples include a deposition method, a printing method, an ink jet method, a spin-coating method, a casting method, a dipping method, a bar coating method, a blade coating method, a roll coating method, a gravure coating method, a flexographic printing method, a spray coating method, and a self-assembling method (a layer-by-layer self-assembling method, self-assembling monolayer method). Among the above, it is preferable to use a deposition method, a spin-coating method, and an ink jet method. In addition, when the light emitting layer is subjected to patterning, separate coating or deposition may be performed by a method of masking a pixel having a different emitting color, or a partition may be formed between light emitting layers. As a material for forming such the partition, a photocuring-type resin such as a photosensitive polyimide resin and an acryl-based resin, or a thermally curing-type resin, and an inorganic material can be used. Further, a material forming the partition may be treated so that surface energy (wettability) is changed.

(3) First Electrode Layer

Next, the first electrode layer used in the present embodiment will be explained. The first electrode layer used in the present embodiment is formed between the organic EL layer and a substrate described layer, and is formed as an electrode which is opposite to the below-described second electrode layer. The first electrode layer may be an anode or a cathode, and may be transparent or translucent, or may not be transparent or translucent. For example, when light is taken out from a substrate side, it is required that the first electrode layer is transparent or translucent and, when light is taken out from the second electrode layer side, the first electrode layer may not be transparent or translucent. In addition, when light is taken out from both sides of the substrate side and the second electrode layer side, it is required that both of the first electrode layer and the second electrode layer are transparent or translucent.

A material for forming the first electrode layer is not particularly limited as long as it is an electrically conductive material. Example of the material includes Au, Ta, W, Pt, Ni, Pd, Cr, Cu, Mo, a metal such as an alkali metal and an alkaline earth metal, oxide of these metals, and alloy such as an Al alloy such as AlLi, AlCa and AlMg, a Mg alloy such as MgAg, a Ni alloy, a Cr alloy, an alloy of an alkali metal, and an alloy of an alkaline earth metal. These electrically conductive materials may be used alone, two or more kinds may be used by combining them, or two or more kinds may be used to laminate them. Further, as the electrically conductive material: an electrically conductive inorganic oxide such as In—Sn—O, In—Zn—O, In—O, Zn—O, Zn—O—Al, Zn—Sn—O and the like; an electrically conductive polymer such as polythiophene, polyaniline, polyacetylene, polyalkylthiophene derivative and polysilane derivative doped with a metal; α-Si; α-Sic and the like may be also used.

In the present embodiment, the first electrode layer may be an anode or a cathode and, usually, the first electrode layer is formed as an anode. When the first electrode layer is formed as an anode, it is preferable to use an electrically conductive material having a large work function value so that the hole is easily injected. Among the above, it is preferable to use at least one kind selected from the group consisting of the metal having work function of 4.5 eV or more, an alloy of such the metal, and the aforementioned electrically conductive inorganic oxide. When work function of the metal is less than 4.5 eV, a hole injecting efficiency is reduced in some cases.

In addition, in order to increase a value of work function of the first electrode layer, UV ozone treatment, oxygen plasma treatment, argon plasma treatment and the like may be performed. For example, when the first electrode layer consisting of the metal is subjected to oxygen plasma treatment, and only the metal on a superficial surface is oxidized, since the value of work function is increased, the hole injecting efficiency can be improved. In this case, oxygen plasma treatment is performed only on a superficial surface of the first electrode layer, because as the thickness of a layer consisting only of the oxidized metal grows larger, insulating property is manifested. Alternatively, when the metal used in the first electrode layer is naturally oxidized, since the oxidized metal present on the surface can be removed by argon plasma treatment, the hole injecting efficiency can be improved.

Further, in order to prevent a short circuit or a leak current of the organic EL element, the first-electrode layer may be subjected to mirror polishing treatment. In mirror polishing treatment, since the first electrode layer can be flattened, a short circuit or a leak current of the organic EL element can be prevented.

In addition, when the first electrode layer is formed as a cathode, it is preferable to use an electrically conductive material having a small value of work function so that an electron is easily injected. As the electrically conductive material having a small value of work function, it is acceptable as long as the value of the work function of the electrically conductive material is smaller than that of the electrically conductive material used in the anode. As when work function of the metal is less than 4.5 eV, the metal is easily oxidized as described above, it is preferable to use at least one kind selected from the group consisting of a metal having work function of 4.2 eV or more, an alloy of such the metal, and the aforementioned electrically conductive inorganic oxide.

A specific resistance value of the first electrode layer is preferably $1 \times 10^{-2}$ Ω·cm or less, further preferably $5 \times 10^4$ Ω·cm or less. When a specific resistance value of the first electrode layer is in the aforementioned range, circuit loss of electric power due to an electrode resistance can be prevented. The specific resistance value is a value measured by a four probing method using Dia Instruments Loresta-GP (MCP-T600).

In the present embodiment, when light is taken out from the substrate side, it is required that the first electrode layer is transparent or translucent and, as a specific light transmittance, it is preferable that an average light transmittance at a visible region of 380 to 780 nm is preferably 50% or more, among the above 80% or more, particularly 85% or more.

In addition, a thickness of the first electrode layer is not particularly limited as long as it is such a thickness that the specific resistance value and the average light transmittance are satisfied, and the thickness is different depending on the electrically conductive material to be used, and is preferably in a range of 40 nm to 500 nm. When the thickness of the first electrode layer is too thin, the resistance is increased in some cases, and when the thickness of the first electrode layer is too thick, there is a possibility that, due to a step difference present at an end part of the first electrode layer which is formed in a pattern manner, cutting or breaking of wire occurs in an organic EL layer, the semiconductor buffer layer or the second electrode layer, or the short circuit between the first electrode layer and the second electrode layer occurs.

Examples of a method for forming the first electrode layer include a sputtering method, a vacuum heating deposition method, an EB deposition method, and an ion plating method.

(4) Second Electrode Layer

Next, the second electrode layer used in the present embodiment will be explained. The second electrode layer used in the present embodiment is formed on the semiconductor buffer layer, and is formed as an electrode opposite to the first electrode layer.

The second electrode layer used in the present embodiment may be an anode or a cathode. In addition, the second electrode layer may be transparent or translucent, or may not be transparent or translucent. For example, when light is taken out from the second electrode layer side, it is required that the second electrode layer is transparent or translucent, but when light is taken out from the substrate side, the second electrode layer may not be transparent or translucent. In addition, when light is taken out from both sides of the substrate side and the second electrode layer side, it is required that both of the first electrode layer and the second electrode layer are transparent or translucent.

Since a forming material, a specific resistance value and an average light transmittance of the second electrode layer are the same as those described in a column of the first electrode layer, explanation is not repeated herein.

A thickness of the second electrode layer is not particularly limited as long as it is such a thickness that the specific resistance value and the average light transmittance are satisfied, and the thickness is different depending on the electrically conductive material to be used, and is preferably in a range of 10 nm to 500 nm. When the thickness of the second electrode layer is too thin, there is a possibility that electrical conductivity is insufficient. Conversely, when the thickness of the second electrode layer is too thick, there is a possibility that light permeability becomes insufficient, and a defect such as crack easily occurs when the organic EL element is deformed during or after a process for manufacturing the organic EL element.

Examples of a method for forming the second electrode layer include a vacuum film making method such a sputtering method, an ion plating method, and an electron beam method. In the present embodiment, since the semiconductor buffer layer is formed between the organic EL layer and the second electrode layer, the organic EL layer can be protected from impact at formation of the second electrode layer. In addition, even when the organic EL layer contains the metal having high reactivity, since oxidation of the metal due to oxygen introduction or release of oxygen from a target at formation of the second electrode layer is prevented by the semiconductor buffer layer, deterioration in property of injecting a charge into the light emitting layer in the organic EL layer can be prevented.

(5) Substrate

Next, substrate used in the present embodiment will be explained. A material for forming the substrate used in the present embodiment is not particularly limited, as long as it is the material having self supporting ability. When light is taken out from the substrate side, it is required that the substrate is transparent, but when light is taken out from the second electrode layer side, it is not necessary for the substrate to have transparency.

Examples of the material used for such the substrate include: the inorganic material such as quartz, glass, silicon wafer, and glass on which TFT (thin film transistor) is formed; and a polymer material such as polycarbonate (PC), polyethylene terephthalate (TET), polybutylene terephthalate (PBT), polyphenylene sulfide (PPS), polyimide (PI), polyamidoimide (PAI), polyethersulfone (PES), polyetherimide (PEI), polyether ether ketone (PEEK) and the like. Among them, it is preferable to use quartz, glass, silicon wafer, or polyimide (PI), polyamidoimide (PAI), polyethersulfone (PES), polyetherimide (PEI), or polyether ether ketone (PEEK) which is a superengineering plastic. These materials have heat resistance of 200° C. or higher, and a substrate temperature in a manufacturing process can be elevated. In particular, when an active driving display using TFT is manufactured, since a temperature is high during the manufacturing process, the aforementioned materials can be suitably used.

In addition, when the aforementioned polymer material is used in the substrate, since there is a possibility that the organic EL layer is deteriorated by a gas generated from this polymer material, it is preferable to provide a gas barrier layer between the substrate and the first electrode layer. Examples of such the gas barrier layer include silicon oxide and silicon nitride.

Further, a substrate whose surface has been subjected to microlens processing, which enhances a light taking out efficiency, may be used. In this case, the first electrode layer and the organic EL layer are formed on the opposite side of the side which has been subjected to microlens processing.

A thickness of the substrate is appropriately selected depending on utility of the material and the organic EL element to be used, and can be, for example, around 0.005 mm to 5 mm.

(6) Charge Injecting/Transporting Layer

Figure 4:
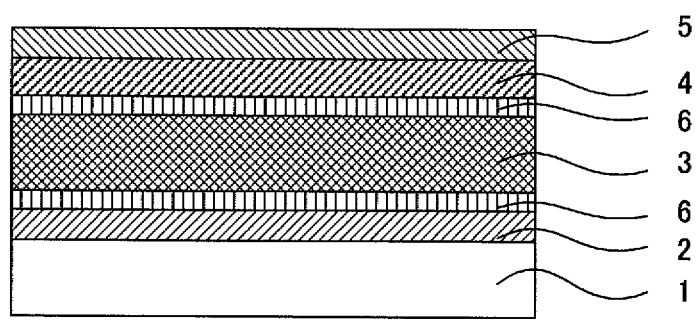
FIG. 4 is a schematic cross-sectional view showing other example of the organic EL element of the present invention.

In the present embodiment, for example, as shown in FIG. 4, a charge injecting/transporting layer 6 may be formed between a light emitting layer in the organic EL layer 3 and a first electrode layer 2, or between a light emitting layer in the organic EL layer 3 and a semiconductor buffer layer 4. As used herein, a charge injecting/transporting layer has function of stably transporting the charge from the first electrode layer or the second electrode layer to the light emitting layer and, by providing such the charge injecting/transporting layer between the light emitting layer and the first electrode layer, or between the light emitting layer and the semiconductor buffer layer, injection of the charge into the light emitting layer is stabilized, and the light emitting efficiency can be enhanced.

Examples of such the charge injecting/transporting layer include the hole injecting/transporting layer for transporting the hole injected from the anode into the light emitting layer, and the electron injecting/transporting layer for transporting an electron injected from the cathode into the light emitting layer similarly. The hole injecting/transporting layer and an electron injecting/transporting layer will be explained below.

(i) Hole Injecting/Transporting Layer

The hole injecting/transporting layer used in the present embodiment is not particularly limited as long as it is a layer which can transport the hole injected from an anode into the light emitting layer. For example, the layer may have either one of: the hole injecting layer having function of stably injecting the hole injected from an anode into the light emitting layer; and the hole transporting layer having function of transporting the hole injected from the anode into the light emitting layer. The layer may have both of the hole injecting layer and the hole transporting layer, or may be a single layer having both functions of hole injecting function and hole transporting function.

In addition, in the present embodiment, the hole injecting/transporting layer is formed on the side of the electrode layer which is to be an anode. For example, when the first electrode layer is an anode, a hole injecting/transporting layer is formed between the light emitting layer and the first electrode layer, and when the second electrode layer is an anode, the hole injecting/transporting layer is formed between the light emitting layer and the semiconductor buffer layer.

A material for forming such the hole injecting/transporting layer is not particularly limited as long as it is the material which can stably transport the hole injected from the anode into the light emitting layer. Examples include, in addition to compounds exemplified for the aforementioned light emitting material of the light emitting layer: oxide such as phenylamine based, starburst-type amine, phthalocyanine based, vanadium oxide, molybdenum oxide, ruthenium oxide and aluminum oxide; and derivatives such as amorphous carbon, polyaniline, polythiophene, polyphenylenevinylene and the like. Specifically, bis(N-(1-naphthyl-N-phenyl)benzidine (α-NPD), 4,4,4-tris(3-methylphenylphenylamino)triphenylamine (MTDATA), poly3,4-ethylenedioxythiophene-polystyrenesulfonic acid (PEDOT-PSS), and polyvinylcarbazole (PVCZ) can be used.

A thickness of the hole injecting layer is not particularly limited as long as it is such a thickness that function, of injecting the hole from the first electrode layer or the second electrode layer and transporting the hole to the light emitting layer, is sufficiently exerted. Specifically, the thickness is preferably in a range of 0.5 nm to 300 nm, among the above in a range of 10 nm to 100 nm.

(ii) Electron Injecting/Transporting Layer

Next, electron injecting/transporting layer used in the present embodiment will be explained. The electron injecting/transporting layer used in the present embodiment is not particularly limited as long as it is a layer which can transport electron injected from a cathode into light emitting layer. For example, the layer may have either one of: electron injecting layer having function of stably injecting the electron injected from cathode into light emitting layer; and electron transporting layer having function of transporting the electron into light emitting layer. The layer may have both of electron injecting layer and electron transporting layer, or may be a single layer having both functions of electron injecting function and electron transporting function.

In addition, in the present embodiment, the electron injecting/transporting layer is formed on the side of the electrode layer which is to be the cathode. For example, when the first electrode layer is the cathode, the electron injecting and transporting layer is formed between the light emitting layer and the first electrode layer, or when the second electrode layer is the cathode, the electron injecting/transporting layer is formed between the light emitting layer and the semiconductor buffer layer.

A material for forming the electron injecting layer used in the present embodiment is not particularly limited as long as it is the material which can stabilize injection of the electron into the light emitting layer. Examples include, in addition to compounds exemplified in the aforementioned light emitting material of the light emitting layer, an alkali metal or an alkaline earth metal, oxide of an alkali metal or an alkaline earth metal, fluoride of an alkali metal or an alkaline earth metal, and an organic complex of an alkali metal, such as aluminum, strontium, potassium, lithium, cesium, magnesium oxide, aluminum oxide, strontium oxide, lithium oxide, lithium fluoride, magnesium fluoride, strontium fluoride, potassium fluoride, barium fluoride, cesium fluoride, and sodium polymethyl methacrylate polystyrene sulfonate. Among the above, it is preferable to use fluoride of an alkaline earth metal, because fluoride of an alkaline earth metal can improve stability and lifetime of the organic EL layer. The reason is as follows: fluoride of an alkaline earth metal has low reactivity with water as compared with the aforementioned alkali metal compounds and oxide of alkaline earth metal, and water absorption is small during or after the formation of the electrode injecting layer. Further, fluoride of an alkaline earth metal has a higher melting point, and is excellent in heat resistance stability as compared with the aforementioned alkali metal compounds.

Conventionally, for example, when an alkali metal, an alkaline earth metal or a rare earth metal is used as the electron injecting layer, and the electron injecting layer is formed between the light emitting layer and the second electrode layer, since the metal is easily oxidized, the metal used in an electron injecting layer is oxidized due to oxygen introduction or release of oxygen from a target at formation of the second electrode layer, and the electron injection function is lost in some cases. On the other hand, in the present embodiment, since the semiconductor buffer layer is formed between the light emitting layer and the second electrode layer, even when the electron injecting layer is formed between the light emitting layer and the semiconductor buffer layer, oxidation of the metal used in the electron injecting layer can be prevented since the electron injecting layer is protected by the semiconductor buffer layer at formation of the second electrode layer.

A thickness of the electron injecting layer is preferably in a range of around 0.2 nm to 10 nm since the aforementioned compound and like of alkali metal or alkaline earth metal has insulating property.

In addition, when a transparent electrically conductive material such as In—Zn—O is used as the cathode, since work function thereof is 4.6 eV or more, it is preferable to form the electron injecting layer using a material having work function of 4.0 eV or less. Although it is difficult to inject the electron from the cathode consisting of In—Zn—O having work function of 4.6 eV or more directly into the light emitting layer under a low driving voltage, injection of the electron becomes easy by providing the electron injecting layer having work function of 4.0 eV or less between the cathode and the light emitting layer. Examples of such the material having work function of 4.0 eV or less include Ba, Ca, Li, Cs, Mg and the like. When the electron injecting layer is formed of such the material, it is preferable that a thickness of the electron injecting layer is in a range of 0.2 nm to 50 nm, among the above 0.2 nm to 20 nm. In this case, since the transparent electrically conductive material is used as the cathode, light can be taken out from the cathode side, and when light is taken out from the cathode side, it is required that the electron injecting layer also has transparency. When the thickness of the electron injecting layer is too thick, there is a possibility that transparency is reduced.

A material for forming the electron transporting layer used in the present embodiment is not particularly limited as long as it is a material which can transport an electron injected from the cathode or the electron injecting layer into the light emitting layer. Examples of an electron transporting organic material include BCP (bathocuproine), Bpehn (bathophenanthroline), phenanthroline derivative, tris(8-quinolinolato)aluminum complex (Alq3) and the like.

In addition, when an electron injecting/transporting layer used in the present embodiment consists of a single layer having both functions of electron injecting function and electron transporting function, a metal-doped layer, of which an electron transporting organic material is doped with an alkali metal or an alkaline earth metal, can be used. Examples of the electron transporting organic material include bathocuproine (BCP), bathophenanthroline (Bphen) and the like. Examples of a doping metal include Li, Cs, Ba and Sr. It is preferable that a mole ratio of the electron transporting organic material and the metal in the metal-doped layer is in a range of 1:1 to 3, among the above, in a range of 1:1 to 2. It is preferable that a thickness of such the metal-doped layer is in a range of 5 nm to 500 nm, among the above, in a range of 10 nm to 100 nm. Since the metal-doped layer has a large electron mobility, and higher light permeability as compared with the metal simple substance, the thickness can be increased as compared with the electron injecting layer.

(iii) Others

In the present embodiment, in some cases, it is preferable to form the electron injecting/transporting layer, depending on the aforementioned aspect of the semiconductor buffer layer (first aspect to fourth aspect), the types of the metal contained in the semiconductor buffer layer, and the types of the second electrode layer (anode, cathode). Hereinafter, each aspect of the semiconductor buffer layer will be explained.

(When the Semiconductor Buffer Layer is the First Aspect)

The present aspect is the case where the semiconductor buffer layer is the mixed semiconductor layer.

In the present aspect, when the second electrode layer is the cathode, if Cu, Ag, Au, Al and the like having work function of 4.0 eV or more is used as a metal contained in the mixed semiconductor, an energy barrier at an interface between the mixed semiconductor layer and the light emitting layer becomes high, and it becomes difficult to inject the electron from the mixed semiconductor layer directly into the light emitting layer under a low voltage, in some cases. For this reason, when the second electrode layer is the cathode, and work function of the metal contained in the mixed semiconductor layer is 4.0 eV or more, it is preferable to provide the electron injecting/transporting layer between the mixed semiconductor layer and the light emitting layer. Thereupon, when light is taken out from the second electrode side, it is preferable that the electron injecting/transporting layer has sufficient light permeability.

On the other hand, when an alkali metal or an alkaline earth metal is used as the metal contained in the mixed semiconductor, since these metals have small work function of 4.0 eV or less, the electron injected from the second electrode layer can be stably injected into the light emitting layer. For this reason, when the second electrode layer is a cathode, and the metal contained in the mixed semiconductor layer is an alkali metal or an alkaline earth metal, it is not necessary that the electron injecting/transporting layer is provided between the mixed semiconductor layer and the light emitting layer.

In addition, in the present aspect, when the second electrode layer is the anode, if an alkali metal or an alkaline earth metal is used as the metal contained in the mixed semiconductor layer, since these metals have small work function of 4.0 eV or less, an energy barrier at an interface between the mixed semiconductor layer and the light emitting layer becomes high, and it becomes difficult to inject the hole from the mixed semiconductor layer directly into the light emitting layer under a low voltage, in some cases. For this reason, when the second electrode layer is the anode, and the metal contained in the mixed semiconductor layer is an alkali metal or an alkaline earth metal, it is preferable that the hole injecting/transporting layer is provided between the mixed semiconductor layer and the light emitting layer. Thereupon, when light is taken out from the second electrode layer side, it is preferable that the hole injecting/transporting layer has sufficient light permeability.

On the other hand, when Cu, Ag, Au, Al and the like having work function of 4.0 eV or more is used as the metal contained in the mixed semiconductor layer, the hole injected from the second electrode layer can be stably injected into the light emitting layer. For this reason, when the second electrode layer is the anode, and the metal contained in the mixed semiconductor layer has work function of 4.0 eV or more, it is not necessary to provide the hole injecting/transporting layer between the mixed semiconductor layer and the light emitting layer.

(When the Semiconductor Buffer Layer is the Second Aspect)

The present aspect is the case where the semiconductor buffer layer comprises the inorganic layer and the metal layer. In the present aspect, it is preferable to provide the charge injecting layer between the light emitting layer and the semiconductor buffer layer. In this case, since the metal layer is formed so as not to be in contact with the organic EL layer, there is a possibility that injection of the charge is insufficient. However, by providing the charge injecting layer between the light emitting layer and the semiconductor buffer layer, the charge can be effectively injected into the light emitting layer. Thereupon, when light is taken out from the second electrode layer side, it is preferable that the charge injecting/transporting layer has sufficient light permeability.

(When the Semiconductor Buffer Layer is the Third Aspect)

The present aspect is the case where the semiconductor buffer layer comprises the mixed semiconductor layer and the inorganic layer.

In the present aspect, when the inorganic layer is formed so as to be in contact with the organic EL layer, it is preferable to provide the charge injecting layer between the light emitting layer and the inorganic layer. In this case, since the metal contained in the mixed semiconductor layer is not brought into contact with the organic EL layer, there is a possibility that injection of the charge is insufficient. However, by providing the charge injecting layer between the light emitting layer and the inorganic layer, the charge can be effectively injected into the light emitting layer. Thereupon, when light is taken out from the second electrode layer side, it is preferable that the charge injecting/transporting layer has sufficient light permeability.

In addition, in the present aspect, when the mixed semiconductor layer is formed so as to be in contact with the organic EL layer, the second electrode layer is the cathode and the metal contained in the mixed semiconductor layer is an alkali metal or an alkaline earth metal, it is not necessary to provide the electron injecting/transporting layer between the mixed semiconductor layer and the light emitting layer. Since these metals have small work function of 4.0 eV or less, the electron injected from the second electrode layer can be stably injected into the light emitting layer.

Further, in the present aspect, when the mixed semiconductor layer is formed so as to be in contact with the organic EL layer, the second electrode layer is the anode, and the metal contained in the mixed semiconductor layer is Cu, Ag, Au, Al and the like as described above, it is not necessary to provide the hole injecting/transporting layer between the mixed semiconductor layer and the light emitting layer. Since these metals have a large work function of 4.0 eV or more, the hole injected from the second electrode layer can be stably injected into the light emitting layer.

(When the Semiconductor Buffer Layer is the Fourth Aspect)

The present aspect is the case where the semiconductor buffer layer comprises the mixed semiconductor layer and the metal layer.

In the present aspect, when the second electrode layer is the cathode, and the metal contained in a layer which is in contact with the organic EL layer, among the mixed semiconductor layer and the metal layer, is an alkali metal or an alkaline earth metal, it is not necessary that the electron injecting/transporting layer is provided between the semiconductor buffer layer and the light emitting layer. Since these metals have small work function of 4.0 eV or less, the electron injected from the second electrode layer can be stably injected into the organic EL layer.

Further, in the present aspect, when the second electrode layer is the anode, and the metal contained in a layer which is in contact with the organic EL layer, among the mixed semiconductor layer and the metal layer, is Cu, Ag, Au, Al and the like having work function of 4.0 eV or more, it is not necessary that the hole injecting/transporting layer is provided between the semiconductor buffer layer and the light emitting layer. The hole injected from the second electrode layer can be stably injected into the organic El layer.

(7) Others

In the present embodiment, a color filter layer and/or a color converting layer may be formed on the second electrode layer. Thereby, light of each color of the light emitting layer in the organic EL layer can be color corrected to enhance color purity.

The color filter layer may be, for example, a red-colored layer, a green-colored layer or a blue-colored layer, and each color filter layer can be formed using a photosensitive resin composition prepared by dispersing one or two or more kinds of a pigment, such as an azo based, a phthalocyanine based, and an anthraquinone based, in a photosensitive resin.

In addition, the color converting layer can be, for example, a red converting layer, a green converting layer or a blue converting layer. Each color converting layer can be formed by a method of coating a coating solution, obtained by dispersing or solubilizing a desired fluorescent pigment and resin, by a spin-coating method, a roll-coating method, a casting method and the like to form a film, and pattering this by a photolithography method.

2. SECOND EMBODIMENT

Next, the second embodiment of the organic EL element of the present invention will be explained. The second embodiment of the organic EL element of the present invention is characterized in comprising: a substrate; an electrode layer formed on the substrate; an organic electroluminescent layer which is formed on the electrode layer and has at least a light emitting layer; and a semiconductor electrode layer which is formed on the organic electroluminescent layer and contains an organic compound having a band gap of 2.0 eV or more and a metal.

Figure 5:
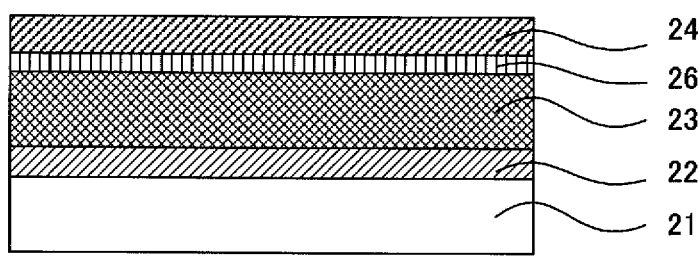
FIG. 5 is a schematic cross-sectional view showing other example of the organic EL element of the present invention.

The organic EL element of the present embodiment will be explained by referring to the drawings. FIG. 5 is a schematic cross-sectional view showing one example of the organic EL element of the present embodiment. In FIG. 5, an organic EL element comprises: a substrate 21; an electrode layer 22 formed on the substrate 21; an organic EL layer 23 which is formed on the electrode layer 22 and has at least a light emitting layer; an electron injecting layer 26 formed on the organic EL layer 23; and a semiconductor electrode layer 24 formed on the electron injecting layer 26.

In the present embodiment, since the semiconductor electrode layer is formed into a film, for example, by the vacuum deposition method, the organic EL layer does not undergo the impact at formation of the semiconductor electrode layer, and light emitting property deterioration of the organic EL element can be avoided. In addition, even when the electron injecting layer is formed between the light emitting layer and the semiconductor electrode layer, since oxygen is not usually introduced in the vacuum deposition method, oxidation of the metal contained in the electron injecting layer can be avoided.

Each component of such the organic EL element will be explained below. Since the organic EL layer and the substrate are the same as those described in the first embodiment, and the electrode layer is the same as the first electrode layer described in the first embodiment, explanation will be omitted herein.

(1) Semiconductor Electrode Layer

First, the semiconductor electrode layer used in the present embodiment will be explained. The semiconductor electrode layer used in the present embodiment is formed on the organic EL layer, and contains the inorganic compound having the band gap of 2.0 eV or more and the metal. The semiconductor electrode layer is formed as an electrode opposite to the electrode layer. The semiconductor electrode layer used in the present embodiment may be an anode or a cathode, and may be transparent or translucent, or may not be transparent or translucent. For example, when light is taken out from the semiconductor electrode layer side, it is required that the semiconductor electrode layer is transparent or translucent. And when light is taken out from the substrate side, the semiconductor electrode layer may not be transparent or translucent. In addition, when light is taken out from both sides of the substrate side and the semiconductor electrode layer side, it is required that both of the semiconductor electrode layer and the electrode layer are transparent or translucent.

The semiconductor electrode layer used in the present embodiment can be classified into four aspects depending on a construction of this semiconductor electrode layer. They are: the case where the semiconductor electrode layer is the mixed semiconductor layer in which the metal is dispersed in the inorganic compound (fifth aspect); the case where the semiconductor electrode layer comprises an inorganic layer comprising the inorganic compound and a metal layer comprising the metal, and this metal layer is formed in the inorganic layer, or on the opposite side of the side on which the organic EL layer is formed (sixth aspect); the case where the semiconductor electrode layer comprises a mixed semiconductor layer in which the metal is dispersed in the inorganic compound, and an inorganic layer comprising the inorganic compound (seventh aspect); and the case where the semiconductor electrode layer comprises a mixed semiconductor layer in which the metal is dispersed in the inorganic compound, and a metal layer comprising the metal (eighth aspect).

Each aspect of such the semiconductor electrode layer will be explained below.

(i) Fifth Aspect

The fifth aspect of the semiconductor electrode layer used in the present embodiment is the mixed semiconductor layer in which the metal is dispersed in the inorganic compound.

The material constituting such the mixed semiconductor layer will be explained below.

(Inorganic Compound)

The inorganic compound used in the present aspect has its band gap of 2.0 eV or more. The inorganic compound used in the present aspect is not particularly limited as long as it can be formed into a layer having function as the electrode, and the same inorganic compounds as those described in the column of the first aspect of the aforementioned "1. First aspect (1) Semiconductor buffer layer" can be used. In addition, in the present aspect, among the above, it is preferable to use at least one kind of inorganic semiconductor compound selected from ZnS, ZnSe, GaN and GaS.

(Metal)

The metal used in the present aspect is not particularly limited as long as it can be formed into a layer having function as the electrode, and it is preferable to use the metal which is less likely to be oxidized, and has work function of 4.0 eV or more. Examples of such the metal include Ag, Al, Au, Be, Co, Cr, Cu, Ga, Fe, In, Ir, Mn, Mo, Nb, Ni, Os, Pb, Pt, Re, Ru, Sb, Sn, Ta, Ti and W. These metals may be used alone, or two or more kinds may be used jointly. In the present aspect, among the above, it is preferable to use a metal having work function of 4.2 eV or more, specifically, Ag, Al, Au, Be, Co, Cr, Cu, Ga, Fe, Ir, Mo, Nb, Ni, Os, Pb, Pt, Re, Ru, Sb, Sn and W are preferably used.

In addition, when the metal contained in the mixed semiconductor layer is made into a layer consisting only of the metal, a thickness of this layer consisting only of the metal is preferably 100 nm or less, among the above in a range of 1 nm to 50 nm, further 1 nm to 30 nm, particularly 1 nm to 20 nm. When the thickness of the layer consisting only of the metal is too thick, there is a possibility that the light transmittance of the mixed semiconductor layer is reduced. Conversely, when the thickness of the layer consisting only of the metal is too thin, there is a possibility that electrically conductivity of the semiconductor buffer layer is reduced. The thickness of the layer consisting only of the metal can be calculated by the aforementioned method described in the first embodiment.

(Semiconductor Electrode Layer)

The thickness of the semiconductor electrode layer in the present aspect is not particularly limited as long as it is such a thickness that a prescribed average light transmittance and electric resistivity are satisfied. Specifically, the thickness is preferably in a range of 1 nm to 500 nm, among the above 10 nm to 200 nm, particularly 10 nm to 100 nm. When a thickness of the semiconductor electrode layer is too thick, there is a possibility that the light transmittance is reduced. Conversely, when the thickness of a semiconductor electrode layer is too thin, there is a possibility that function as the electrode is not obtained.

Since an average light transmittance, an electric resistivity and a forming method of the semiconductor electrode layer are the same as those of the semiconductor buffer layer described in the column of the first aspect of the aforementioned "1. First aspect (1) Semiconductor buffer layer", explanation will be omitted herein.

(ii) Sixth Aspect

The sixth aspect of the semiconductor electrode layer used in the present aspect comprises: an inorganic layer comprising the inorganic compound; and a metal layer comprising the metal, and this metal layer is formed in the inorganic layer, or on an opposite side to a side on which the organic EL layer is formed.

Figure 6:
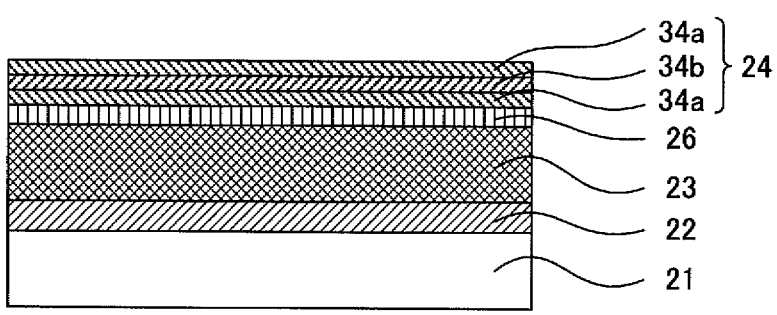
FIG. 6 is a schematic cross-sectional view showing other example of the organic EL element of the present invention.
Figure 7:
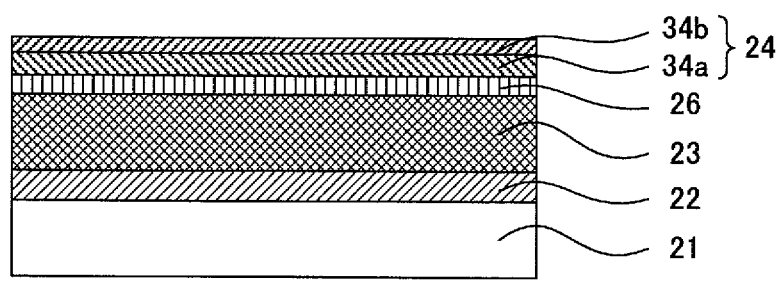
FIG. 7 is a schematic cross-sectional view showing other example of the organic EL element of the present invention.

A forming position of the inorganic layer and the metal layer in the present aspect may be such that the metal layer 34b is formed so as to be held by inorganic layers 34a as shown in FIG. 6, or a metal layer 34b is formed on the inorganic layer 34a, that is, formed on the opposite side to the side on which the organic EL layer 23 is formed, as shown in FIG. 7. In addition, since a construction is acceptable that the metal layer is not in contact with the organic EL layer, a plurality of metal layers and a plurality of inorganic layers may be laminated.

In addition, a thickness of the metal layer in the present aspect is preferably 100 nm or less, among the above, in a range of 1 nm to 50 nm, further 1 nm to 30 nm, particularly preferably 1 nm to 20 nm. When the thickness of the metal layer is too thick, there is a possibility that a light transmittance of the semiconductor electrode layer is reduced. Conversely, when the thickness of the metal layer is too thin, there is a possibility that electrically conductivity of the semiconductor electrode layer is reduced.

Since other respects of the metal layer, and the inorganic layer are the same as those described in the column of the aforementioned second aspect of "1. First embodiment (1) Semiconductor buffer layer", and since an average light transmittance and an electric resistivity of a semiconductor electrode layer are the same as those of the semiconductor buffer layer described in a column of the first aspect of "1. First embodiment (1) Semiconductor buffer layer", explanation will be omitted herein. Further, a thickness of the semiconductor electrode layer, and the inorganic compound and the metal which are preferably used are the same as those of the fifth aspect.

(iii) Seventh Aspect

The seventh aspect of the semiconductor electrode layer used in the present embodiment comprises: a mixed semiconductor layer in which the metal is dispersed in the inorganic compound; and an inorganic layer comprising the inorganic compound.

A forming position of the mixed semiconductor layer and the inorganic layer in the present aspect is not particularly limited, and the mixed semiconductor layer and the inorganic layer may be laminated in this order from the organic EL layer side, or the inorganic layer and the mixed semiconductor layer may be laminated in this order. Alternatively, a plurality of mixed semiconductor layers and a plurality of inorganic layers may be laminated.

Since the mixed semiconductor layer is the same as that described in the column of the aforementioned first aspect of "1. First embodiment (1) Semiconductor buffer layer", and the inorganic layer is the same as that described in a column of the aforementioned second aspect of "11. First embodiment (1) Semiconductor buffer layer", explanation will be omitted herein. In addition, since an average light transmittance and an electric resistivity of the semiconductor electrode layer are the same as those of the semiconductor buffer layer described in the column of the aforementioned first aspect of "1. First embodiment (1) Semiconductor buffer layer", explanation will be omitted herein. Further, a thickness of the semiconductor electrode layer, and the inorganic compound and the metal which are preferably used are the same as those of the aforementioned fifth aspect.

(iv) Eighth Aspect

The eighth aspect of the semiconductor electrode layer used in the present embodiment comprises: a mixed semiconductor layer in which the metal is dispersed in the inorganic compound; and a metal layer comprising the metal.

A forming position of the mixed semiconductor layer and the metal layer in the present aspect is not particularly limited. The mixed semiconductor layer and the metal layer may be laminated in this order from the organic EL layer side, or the metal layer and the mixed semiconductor layer may be laminated in this order. Alternatively, a plurality of mixed semiconductor layers and a plurality of metal layers may be laminated.

Since the mixed semiconductor layer is the same as that described in the column of the aforementioned first aspect of "1. First-embodiment (1) Semiconductor buffer layer", a metal layer is the same as that described in a column of the aforementioned fourth aspect of "1. First embodiment (1) Semiconductor buffer layer", and the light transmittance, an electric resistivity and the like of the semiconductor electrode layer are the same as those of the semiconductor buffer layer described in the column of the first aspect of "1. First embodiment (1) Semiconductor buffer layer", explanation will be omitted herein. Further, a thickness of the semiconductor electrode layer, the thickness of the metal layer, and the inorganic compound and the metal which are preferably used are the same as those of the fifth aspect.

(v) Others

The semiconductor electrode layer in the present embodiment, the mixed semiconductor layer, the metal layer and the inorganic layer may be laminated, in addition to the aforementioned components. In this case, a forming position of the mixed semiconductor layer, the metal layer and the inorganic layer is not particularly limited. Examples include: the case where the mixed-semiconductor layer, the metal layer and the inorganic layer are laminated in this order from the organic EL layer side; and the case where the inorganic layer, the mixed semiconductor layer and the metal layer are laminated in this order.

(6) Charge Injecting/Transporting Layer

Figure 8:
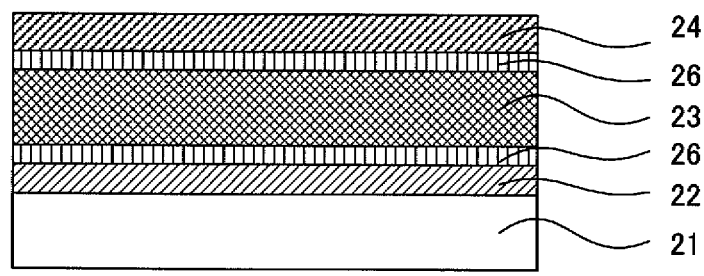
FIG. 8 is a schematic cross-sectional view showing other example of the organic EL element of the present invention.

In the present embodiment, for example, as shown in FIG. 8, a charge injecting/transporting layer 26 may be formed between a light emitting layer in the organic EL layer 23 and an electrode layer 22, or between a light emitting layer in the organic EL layer 23 and a semiconductor electrode layer 24. The charge injecting/transporting layer has function of stably transporting the charge from the electrode layer or the semiconductor electrode layer to the light emitting layer. And by providing such the charge injecting/transporting layer between the light emitting layer and the electrode layer, or between the light emitting layer and the semiconductor electrode layer, injection of the charge into the light emitting layer can be stabilized, and the light emitting efficiency can be enhanced.

Since the charge injecting/transporting layer is the same as that described in the aforementioned first embodiment, explanation will be omitted herein.

In the present embodiment, it is preferable to form the charge injecting/transporting layer, in some cases, depending on the aforementioned aspect of the semiconductor electrode layer (fifth aspect to eighth aspect), a kind of the metal contained in the semiconductor electrode layer, and a kind of the semiconductor electrode layer (anode, cathode). Each aspect of the semiconductor electrode layer will be explained below.
(When the Semiconductor Electrode Layer is the Fifth Aspect)

The present aspect is the case where the semiconductor electrode layer is the mixed semiconductor layer.

In the present aspect, when the semiconductor electrode layer is the cathode, and work function of the metal contained in the mixed semiconductor layer, which is the semiconductor electrode layer, is 4.0 eV or more, it is preferable to provide the electron injecting/transporting layer between the mixed semiconductor layer and the light emitting layer. When a value of work function of the metal is large, an energy barrier at an interface between the mixed semiconductor layer and the light emitting layer will be high, and it becomes difficult to inject the electron from the mixed semiconductor layer directly into the light emitting layer under a low voltage, in some cases. However, by providing the electron injecting/transporting layer between the mixed semiconductor layer and the light emitting layer, the electron can be effectively injected into the light emitting layer. Thereupon, when light is taken out from the mixed semiconductor layer side, it is preferable that the electron injecting/transporting layer has sufficient light permeability.

Further, when the semiconductor electrode layer is the anode, and work function of the metal contained in the mixed semiconductor layer, which is the semiconductor electrode layer, is 4.0 eV or more, it is not necessary to provide the hole injecting/transporting layer between the mixed semiconductor layer and the light emitting layer. This is because since the value of work function of the metal is large, the hole can be stably injected into the light emitting layer.
(When the Semiconductor Electrode Layer is the Sixth Aspect)

The present aspect is the case where the semiconductor electrode layer comprises the inorganic layer and the metal layer. In the present aspect, it is preferable to provide the charge injecting/transporting layer between the light emitting layer and the semiconductor electrode layer. In this case, since the metal layer is formed so as not to be in contact with the organic EL layer, there is a possibility that injection of the charge is insufficient. However, by providing the charge injecting/transporting layer between the light emitting layer and the semiconductor electrode layer, the charge can be effectively injected into the light emitting layer. Thereupon, when light is taken out from the semiconductor electrode layer side, it is preferable that the charge injecting/transporting layer has sufficient light permeability.
(When the Semiconductor Electrode Layer is the Seventh Aspect)

The present aspect is the case where the semiconductor electrode layer comprises the mixed semiconductor layer and the inorganic layer.

In the present aspect, when the inorganic layer is formed so as to be in contact with the organic EL layer, it is preferable to provide the charge injecting/transporting layer between the light emitting layer and the inorganic layer. In this case, since the metal contained in the mixed semiconductor layer is not brought into contact with the organic EL layer, there is a possibility that injection of the charge is insufficient. However, by providing the charge injecting/transporting layer between the light emitting layer and the inorganic layer, the charge can be effectively injected into the light emitting layer. Thereupon, when light is taken out from the semiconductor electrode layer side, it is preferable that the charge injecting/transporting layer has sufficient light permeability.

Further, in the present aspect, when the mixed semiconductor layer is formed so as to be in contact with the organic EL layer, the semiconductor electrode layer is the anode, and work function of the metal contained in the mixed semiconductor layer is 4.0 eV or more, it is not necessary to provide the hole injecting/transporting layer between the mixed semiconductor layer and the light emitting layer. This is because since the value of work function of the metal is large, the hole can be stably injected into the light emitting layer.
(When the Semiconductor Electrode Layer is the Eighth Aspect)

The present aspect is the case where the semiconductor electrode layer has the mixed semiconductor layer and the metal layer.

In the present aspect, when the semiconductor electrode layer is the anode, and work function of the metal contained in a layer which contacts with the organic EL layer, among the mixed semiconductor layer and the metal layer, is 4.0 eV or more, it is not necessary to provide the hole injecting/transporting layer between the semiconductor electrode layer and the light emitting layer. This is because since a value of work function of the metal is large, the hole can be stably injected into the light emitting layer.

Since other respects of the organic EL element are the same as those described in the first embodiment, explanation will be omitted herein.

The present invention is not limited to the aforementioned embodiments. The aforementioned embodiments are examples, and any embodiments having substantially the same constitution as the technical idea described in claims of the present invention, and exerting the same function and effect are included in the technical scope of the present invention.

EXAMPLES

The present invention will be specifically explained below using Examples and Comparative Examples.

Example 1

Formation of First Electrode Layer

As a substrate, a transparent glass substrate having a size of 40 mm×40 mm and a thickness of 0.7 mm (alkaliless glass NA35 manufactured by NH Technoglass) was prepared, this transparent glass substrate was cleaned according to a conventional method, and a thin film of an indium zinc oxide compound (IZO) (thickness 130 nm) was formed as an anode on the transparent glass substrate by a sputtering method. Upon formation of the IZO thin film, a mixed gas of Ar and $O_2$ (volume ratio Ar:$O_2$=100:1) was used as a sputtering gas, and a pressure of 0.1 Pa and a DC output of 150 W were used. Further, a photosensitive resist (OFPR-800 manufactured by Tokyo Ohka Kogyo Co., Ltd.) was coated on the IZO thin film (anode), and mask exposure, development (using NMD3 manufactured by Tokyo Ohka Kogyo Co., Ltd.) and etching were performed to pattern an IZO thin film (anode).
(Formation of Hole Injecting/Transporting Layer)

The aforementioned transparent glass substrate provided with the IZO thin film (anode) was cleaned, subjected to UV ozone treatment, and the transparent glass substrate was coated with polyethylenedioxythiophene-polystyrenesulfonate (PEDOT-PSS) represented by the following chemical formula (1), in the atmosphere, by a spin-coating method so as to cover the IZO thin film (anode). The above was dried to form a hole injecting/transporting layer (thickness 80 nm).

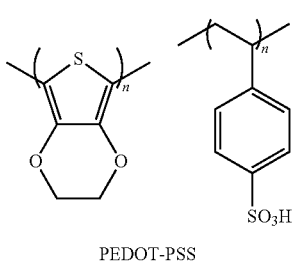

PEDOT-PSS (1)

Wherein, in the formula (1), n is 10,000 to 500,000.

(Formation of Light Emitting Layer)

In a glove box in a low oxygen (oxygen concentration 1 ppm or lower) and low humidity (water steam concentration 1 ppm or lower) state, polymer (5BTF8) formed of poly(9,9dioctylfluorene-co-benzothiazole) (F8BT) and poly(9,9dioctylfluorene) (PF8) represented by the following chemical formula (2) was coated on the aforementioned hole injecting/transporting layer by a spin-coating method, and this was dried to form a light emitting layer (thickness 80 nm). The polymer (5BTF8) is a light emitting material obtained by blending F8BT and PF8 at a weight ratio 5:95.

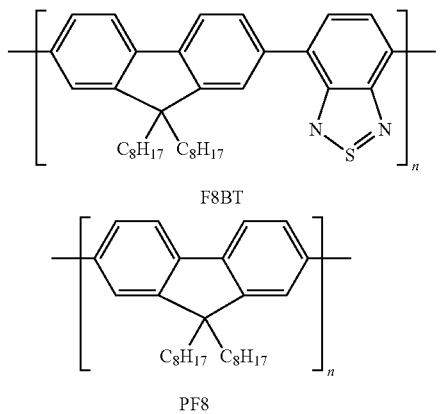

(2)

F8BT

PF8

Wherein, in the formula (2), n is 100,000 to 1,000,000.

(Formation of Electron Injecting Layer)

Ca was deposited on the light emitting layer at a thickness of 3 nm to form an electron injecting layer. Deposition conditions were: a vacuum degree of $5 \times 10^{-5}$ Pa; and a film making rate of 1 Å/sec.

(Formation of Semiconductor Buffer Layer)

ZnSe and Ca were co-deposited on the electron injecting layer to form a semiconductor buffer layer having a thickness of 30 nm. Deposition conditions were: a volume ratio of ZnSe and Ca of 10:1; a vacuum degree of $5 \times 10^{-5}$ Pa; a rate of making a film of ZnSe of 1 Å/sec; and a rate of making a film of Ca of 0.1 Å/sec.

(Formation of Second Electrode. Layer)

Further, to form a cathode, an IZO thin film (thickness 100 nm) was formed on the semiconductor buffer layer, by a counter target sputtering method. Upon formation of the IZO thin film, Ar was used as a sputtering gas, and a pressure of $7.0 \times 10^{-2}$ Pa, a DC output of 150 W, and a RF output of 100 W were used.

(Manufacture of Organic El Element)

After the second electrode layer was formed, in a glove box in a low oxygen (oxygen concentration 1 ppm or lower) and low humidity (water steam concentration 1 ppm or lower), sealing was performed with an alkaliless glass. By the aforementioned series of procedures, an organic EL element having four places of light emitting areas (area 4 mm$^2$) was manufactured. The organic EL element comprises: an anode which was patterned in a form of lines with a width of 2 mm; an electron injecting layer which is patterned in a form of lines having a width of 2 mm so as to cross with the pattern of the anode perpendicularly; a semiconductor buffer layer; and a cathode.

When a voltage of 6 V was applied to the anode and the cathode of this organic EL element, a current density was about 215 mA/cm$^2$, and a brightness of the light emitting area measured from an upper surface (cathode) side was about 4000 cd/m$^2$. From this result, it was confirmed that, in the light emitting area, because the semiconductor buffer layer, which is a mixed semiconductor layer of ZnSe and Ca, exists, oxidation of the light emitting layer and the electron injecting layer at formation of a cathode, and damage at sputtering are prevented.

(Evaluation of Light Transmittance and Specific Resistance)

In addition, an electron injecting layer, a semiconductor buffer layer and a second electrode layer were successively formed in this order on a transparent glass substrate by the aforementioned forming method to prepare a laminate. Regarding this laminate, a specific resistance value and a light transmittance in a visible region of 380 to 780 nm were measured under the following conditions. As a result, an average light transmittance in a visible region was about 60%, and a light transmittance at a wavelength of 500 nm was about 70%. Further, an average specific resistance value of the laminate (thickness 130 nm) was $8 \times 10^{-3}$ Ω·cm.

<Measurement of Film Thickness>

For a film thickness, a cross-section of a film was measured by using Nanopics 1000 manufactured by Seiko Instruments.

<Measurement of Light Transmittance>

A light transmittance was measured at room temperature in the atmosphere, by using an ultra violet and visible spectrophotometer UV-2200A manufactured by Shimadzu Corporation <Measurement of Specific Resistance Value>

A specific resistance value was measured by a four probing method using Dia Instruments Loresta-GP (MCP-T600)

Example 2

An organic EL element was manufactured by the same manner as that of Example 1, except that, as the semiconductor buffer layer, ZnS and Ca were co-deposited to form a semiconductor buffer layer having a thickness of 30 nm. Deposition conditions upon formation of the semiconductor buffer layer were: a volume ratio of ZnS and Ca of 10:1; a vacuum degree of $5 \times 10^{-5}$ Pa; a rate of forming a film of ZnS of 1 Å/sec; and a rate of forming a film of Ca of 0.1 Å/sec.

When a voltage of 6V was applied to the anode and the cathode of the organic EL element, a current density was about 230 mA/cm$^2$, and a brightness of the light emitting area measured from an upper surface (cathode) side was about 4500 cd/m². From this result, it was confirmed that, because the semiconductor buffer layer, which is the mixed semiconductor layer of ZnS and Ca, exists, oxidation of the light emitting layer and the electron injecting layer at formation of the cathode, and damage due to sputtering were prevented.

Example 3

Formation of First Electrode Layer

As a substrate, a transparent glass substrate having a size of 40 mm×40 mm and a thickness of 0.7 mm (alkaliless glass NA35 manufactured by NH Technoglass) was prepared, this transparent glass substrate was cleaned by a conventional method, and a thin film composed of chromium having a thickness of 150 nm was formed as an anode, on the transparent glass substrate, by a magnetron sputtering method. Upon formation of the chromium thin film, Ar was used as a sputtering gas, and a pressure of 0.3 Pa, and a DC output of 200 W were used. Thereafter, patterning of the chromium thin film (anode) was performed by a photolithography method (resist: OFPR-800 manufactured by Tokyo Ohka Kogyo Co., Ltd., etchant: Cr-01N manufactured by KANTO KAGAKU) so that a pattern of 2 mm width line×2 was obtained.

Further, the transparent glass substrate provided with the chromium thin film (anode) was subjected to plasma treatment. Initially, Ar was used as a sputtering gas, and a pressure of 1.0 Pa and a RF output of 100 W were used. After removing an oxidized layer at a surface of the chromium thin film, which had been naturally oxidized, plasma treatment was performed for 1 minute using Ar and $O_2$ as sputtering gas, at a gas partial pressure of $Ar:O_2=1:1$, a pressure of 1.0 Pa and a RF output of 100 W.

(Formation of a Hole Injecting/Transporting Layer, Light Emitting Layer, Electron Injecting Layer, and Semiconductor Buffer Layer)

By the same manner as that of Example 1, a hole injecting/transporting layer, a light emitting layer, an electron injecting layer, and a semiconductor buffer layer were successively formed on the chromium thin film (anode).

(Formation of Second Electrode Layer)

Further, an IZO thin film (thickness 100 nm) was formed as the cathode on the semiconductor buffer layer by a counter target sputtering method. Upon formation of the IZO thin film, Ar was used as a sputtering gas, and a pressure of 0.07 Pa, RF output of 100 W and a DC output of 5 W were used.

(Manufacturing of Organic El Element)

By the same manner as that of Example 1, sealing was performed to manufacture an organic EL element.

When a voltage of 6 W was applied to the anode and the cathode of the organic EL element, a current density was about 220 mA/cm², and a brightness of the light emitting area measured from an upper surface (cathode) side was about 9000 cd/m². From this result, it was confirmed that, because the semiconductor buffer layer, which is the mixed semiconductor layer of ZnSe and Ca, exists, oxidation of the light emitting layer and the electron injecting layer at formation of the cathode, and damage at sputtering were prevented.

Comparative Example 1

An organic EL element was manufactured by the same manner as that of Example 1, except that the IZO thin film as a cathode was formed on the electron injecting layer, without forming the semiconductor buffer layer.

When a voltage of 6 V was applied to the anode and the cathode of the organic EL display, a current density was about 0.18 mA/cm², and a brightness of the light emitting area measured from an upper surface (cathode) side was about 0.2 cd/m². From this result, it was confirmed that, in an organic EL element in which the semiconductor buffer layer is not formed, light emitting property is deteriorated due to oxidation of the electron injecting layer by oxygen at formation of the cathode.

Comparative Example 2

An organic EL element was manufactured by the same manner as that of Example 1, except that, as the semiconductor buffer layer, only ZnSe was used to form a 30 nm semiconductor buffer layer.

When a voltage of 6 V was applied to the anode and the cathode of the organic EL element, a current density was about 19 mA/cm², and a brightness of the light emitting area measured from upper surface (cathode) side was about 1000 cd/m². From this result, it was confirmed that, in an organic EL element in which the metal is not contained in the semiconductor buffer layer, charge transporting function in the semiconductor buffer layer is reduced, and light emitting property is deteriorated.

Comparative Example 3

An organic EL element was manufactured by the same manner as that of Example 1, except that, as the semiconductor buffer layer, only ZnS was used to form a 30 nm semiconductor buffer layer.

When a voltage of 6 V was applied to the anode and the cathode of the organic EL element, a current density was about 50 mA/cm², and a brightness of the light emitting area measured from an upper surface (cathode) side was about 1480 cd/m². From this result, it was confirmed that, in an organic EL element in which the metal is not contained in the semiconductor buffer layer, charge transporting function of the semiconductor buffer layer is deteriorated, and light emitting property is deteriorated.

Example 4

Formation of First Electrode Layer

By the same manner as that of Example 1, an IZO thin film as an anode was formed on a transparent glass substrate.

(Formation of Hole Injecting Layer and Hole Transporting Layer)

The transparent glass substrate provided with the IZO thin film (anode) was exposed to oxygen plasma. Thereafter, a hole injecting layer (thickness 30 nm) formed of tris[naphthyl(phenyl)amino]triphenylamine (1-TNATA), represented by the following chemical formula (3), was formed on the transparent glass substrate, by a vacuum heating deposition method, so as to cover the IZO thin film (anode). Conditions for forming a film of this hole injecting layer were: a vacuum degree of $5\times10^{-5}$ Pa; a rate of forming a film of 2 Å/sec; and a heating temperature of 350° C.

(3)

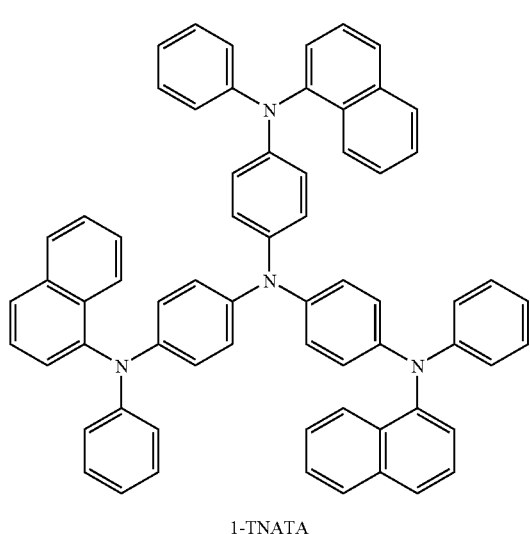

1-TNATA

Further, a hole transporting layer (thickness 30 nm) formed of bis(N-naphtyl)-N-phenylbenzidine (α-NPD), represented by the following chemical formula (4), was formed on the hole injecting layer by a vacuum deposition method. Conditions for forming a film of this hole transporting layer were: a vacuum degree of $5\times10^{-5}$ Pa; a rate of forming a film of 2 Å/sec; and a heating temperature of 350° C.

(4)

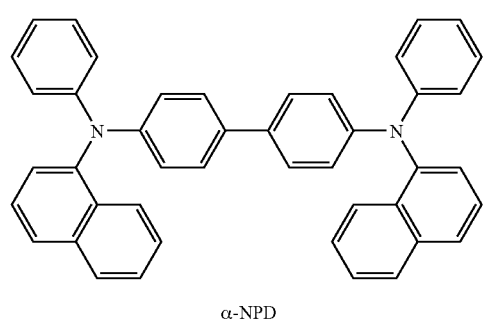

α-NPD (Formation of Light Emitting Layer)

A tris(8-quinolinolato)aluminum complex (Alq3) represented by the following chemical formula (5) and coumarin (C6) represented by the following chemical formula (6) were formed into a film, on the hole transporting layer, by co-deposition, to form a light emitting layer (thickness 40 nm). Conditions for forming the film of this light emitting layer were: C6 was doped so that C6 will be contained in Alq3 by a weight ratio of 1%; a vacuum degree of $5\times10^{-5}$ Pa; and a rate of forming a Alq3 film of 2 Å/sec.

(5)

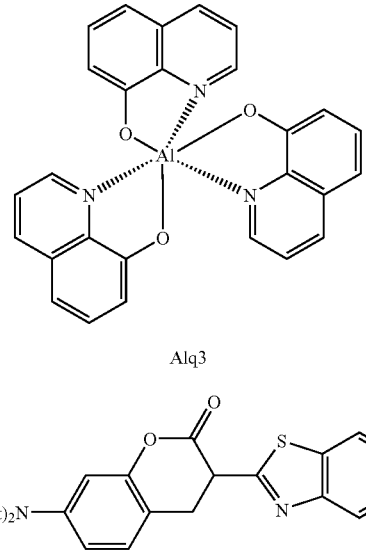

Alq3

(6)

C6

(Formation of Electron Transporting Layer and Electron Injecting Layer)

An electron transporting layer (thickness 20 nm) formed of bathocuproin (BCP) represented by the following chemical formula (7) was formed on the light emitting layer by a vacuum deposition method. Conditions for forming the film of this electron transporting layer were: a vacuum degree of $5\times10^{-5}$ Pa; and a rate of forming a film of 2 Å/sec.

(7)

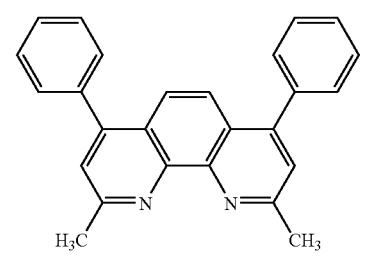

BCP

Further, an electron injecting layer (thickness 3 nm) formed of Li was formed on the electron transporting layer by a vacuum deposition method. Conditions for forming a film of this electron injecting layer were: a vacuum degree of $5\times10^{-5}$ Pa; and a rate of forming a film of 0.2 Å/sec.

(Formation of Semiconductor Buffer Layer and Second Electrode Layer)

An organic EL element was manufactured by forming the semiconductor buffer layer and the second electrode layer, and sealing by the same manner as that of Example 2.

When a voltage of 6 V was applied to the anode and the cathode of this organic EL element, a current density was about 150 mA/cm², and a brightness of the light emitting area measured from an upper surface (cathode) side was about 3300 cd/m². From this result, it was confirmed that, because the semiconductor buffer layer, which is the mixed semiconductor layer of ZnS and Ca, exists, oxidation of the electron injecting layer at formation of the cathode, and damage of the light emitting layer and the electron injecting layer in sputtering were prevented.

Example 5

Formation of First Electrode Layer

By the same manner as that of Example 1, an IZO thin film as a cathode was formed on a transparent glass substrate.
(Formation of Electron Injecting Layer and Electron Transporting Layer)

The transparent glass substrate provided with the IZO thin film (cathode) was exposed to argon plasma. Thereafter, BCP and Li were co-deposited on the transparent glass substrate by a vacuum heating deposition method so as to cover the IZO thin film (cathode), to form an electron injecting layer (thickness 20 nm). Conditions for forming the film of this electron injecting layer were: a vacuum degree of $5\times10^{-5}$ Pa; a rate of forming a BCP film of 2 Å/sec; and co-deposition at a mole ratio of BCP and Li of 1:2.

Further, by the same manner as that of Example 4, an electron transporting layer (thickness 20 nm) formed of BCP was formed on the electron injecting layer.
(Formation of Light Emitting Layer)

By the same manner as that of Example 4, a light emitting layer (thickness 40 nm) formed of Alq3 and C6 was formed on the electron transporting layer.
(Formation of Hole Transporting Layer and Hole Injecting Layer)

By the same manner as that of Example 4, a hole transporting layer (thickness 30 nm) formed of α-NPD and a hole injecting layer (thickness 30 nm) formed of 1-TNATA were successively formed on the light emitting layer.
(Formation of Semiconductor Buffer Layer)

ZnS and Au were co-deposited on the hole injecting layer to form a semiconductor buffer layer having a thickness of 30 nm. Conditions for forming a film of this semiconductor buffer layer were: a volume ratio of ZnS and Au of 10:1; a vacuum degree of $5\times10^{-5}$ Pa; a rate of forming a ZnS film of 1 Å/sec; and a rate of forming an Au film of 0.1 Å/sec.
(Formation of Second Electrode Layer)

An IZO thin film (thickness 100 nm), as an anode, was formed on the semiconductor buffer layer, and sealing was performed to manufacture an organic EL element.

When a voltage of 6 V was applied to the anode and the cathode of this organic EL element, a current density was about 101 mA/cm$^2$, and a brightness of the light emitting area measured from an upper surface (anode) side was about 2800 cd/m$^2$. From this result, it was confirmed that, because the semiconductor buffer layer, which is brightness mixed semiconductor layer of ZnS and Au, exists, damage of the light emitting layer, the hole transporting layer and the hole injecting layer due to sputtering at formation of the anode was prevented.

Comparative Example 4

An organic EL element was manufactured by the same manner as that of Example 4, except that the IZO thin film as a cathode was formed on the electron injecting layer without forming a semiconductor buffer layer.

When a voltage of 6 V was applied to the anode and the cathode of the organic EL element, a current density was about 1.2 mA/cm$^2$, and a brightness of the light emitting area measured from an upper surface (cathode) side was about 4.6 cd/m$^2$. From this result, it was confirmed that, in an organic EL element in which the semiconductor buffer layer is not formed, due to oxidation of the electron injecting layer at formation of the cathode, and damage of the light emitting layer and the electron transporting layer by sputtering, leak current is often caused so that light emitting property is deteriorated.

Comparative Example 5

An organic EL element was manufactured by the same manner as that of Example 4, except that, as the semiconductor buffer layer, a semiconductor buffer layer (thickness 30 nm) consisting only of ZnS was formed.

When a voltage of 6 V was applied to the anode and the cathode of the organic EL element, a current density was about 80 mA/cm$^2$, and a brightness of the light emitting area measured from an upper surface (cathode) side was about 4100 cd/m$^2$. From this result, it was confirmed that, in an organic EL element in which the metal is not contained in the semiconductor buffer layer, charge transporting function of the semiconductor buffer layer is deteriorated, and light emitting property is deteriorated.

Example 6

An organic EL element was manufactured by the same manner as that of Example 1, except that, as the semiconductor buffer layer, ZnS was deposited at a thickness of 30 nm, thereafter, Au was deposited to be 5 nm, and further, ZnS was deposited at 30 nm to form the semiconductor buffer layer formed of the organic layer (ZnS), the metal layer (Au) and the inorganic layer (ZnS).

When a voltage of 6 V was applied to the anode and the cathode of this organic EL element, a current density was about 190 mA/cm$^2$, and a brightness of the light emitting area measured from an upper surface (cathode) side was about 4000 cd/m$^2$. From this result, it was confirmed that, because the semiconductor buffer layer having a laminated construction of ZnS/Au/ZnS exists, oxidation of the light emitting layer and the electron injecting layer at formation of the cathode, and damage due to sputtering were prevented.

Example 7

By the same manner as that of Example 1, an IZO thin film (cathode), a hole injecting/transporting layer, a light emitting layer, and an electron injection layer were successively formed on a transparent glass substrate. Thereafter, ZnSe and Au were co-deposited on the electron injecting layer to form a semiconductor electrode layer (anode) having a thickness of 100 nm, thereby, an organic EL element was manufactured. Conditions for forming the film of the semiconductor electrode layer were: a volume ratio of ZnSe and Au of 10:1; a vacuum degree of $5\times10^5$ Pa; a rate of forming a ZnSe film of 1 Å/sec; and rate of forming an Au film of 0.1 Å/sec.

When a voltage of 6 V was applied to the anode and the cathode of this organic EL element, a current density was about 210 mA/cm$^2$, and a brightness of the light emitting area measured from an upper surface (cathode) side was about 4300 cd/m$^2$. From this result, it was confirmed that, since the anode can be formed into a film without performing sputtering by forming the semiconductor electrode layer, which is the mixed semiconductor layer of ZnSe and Au, oxidation of the light emitting layer and the electron injecting layer, and damage due to sputtering can be avoided, and better property can be obtained.

Example 8

An organic EL element was manufactured by the same manner as that of Example 1, except that, as the semiconductor buffer layer, $CaF_2$ and Au were co-deposited to form the semiconductor buffer layer having a thickness of 30 nm. Deposition conditions were: a volume ratio of $CaF_2$ and Au of 2:1; a vacuum degree of $5\times10^{-5}$ Pa; a rate of forming a $CaF_2$ film of 1 Å/sec; and a rate of forming an Au film of 0.5 Å/sec. A light transmittance of only the semiconductor buffer layer having a thickness of 30 nm was about 65% at a wavelength of 510 nm.

When a voltage of 6 V was applied to the anode and the cathode of this organic EL element, a current density was about 190 mA/cm$^2$, and a brightness of the light emitting area measured from an upper surface (cathode) side was about 3500 cd/m$^2$. From this result, it was confirmed that, because the semiconductor buffer layer, which is the mixed semiconductor layer of $CaF_2$ and Au, exists, oxidation of the light emitting layer and the electron injecting layer at formation of the cathode, and damage due to sputtering are prevented.

Example 9

By the same manner as that of Example 1, an anode, a hole injecting/transporting layer, a light emitting layer and an electron injecting layer were formed on a transparent glass substrate. $CaF_2$ and Au were co-deposited on this electron injecting layer to form a semiconductor electrode layer having a thickness of 50 nm. Deposition conditions were: volume ratio of $CaF_2$ and Au of 2:1; a vacuum degree of $5\times10^{-5}$ Pa; a rate of forming a $CaF_2$ film of 1 Å/sec; and a rate of forming an Au film of 0.5 Å/sec. A light transmittance of only the semiconductor electrode layer having a thickness of 50 nm was about 52% at a wavelength of 510 nm.

When a voltage of 6 V was applied to the anode and the cathode of this organic EL element, a current density was about 160 mA/cm$^2$, and a brightness of the light emitting area measured from an upper surface (cathode) side was about 3000 cd/m$^2$. From this result, it was confirmed that, by forming the semiconductor electrode layer, which is a mixed semiconductor layer of $CaF_2$ and Au, using a vacuum deposition method, a cathode can be formed without damaging the light emitting layer, and oxidation of the electron injecting layer is prevented.

What is claimed is:

1. An organic electroluminescent element comprising:
a substrate;
a first electrode layer formed on the substrate;
an organic electroluminescent layer which is formed on the first electrode layer, and has at least a light emitting layer;
a semiconductor buffer layer which is formed on the organic electroluminescent layer, and consists of an inorganic compound having a band gap of 2.0 eV or more and a metal; and
a second electrode layer formed on the semiconductor buffer layer,
wherein the semiconductor buffer layer is a mixed semiconductor layer in which the metal is dispersed in the inorganic compound,
the inorganic compound is an inorganic semiconductor compound,
the inorganic semiconductor compound is at least one kind of element selected from the group consisting of ZnTe, GaS, $Ga_2S_3$, GaP, GaSe, AlAs, AlSb, $Al_2Se_3$, BP, BAs, and HgS,
the second electrode layer contains an electrically conductive inorganic oxide, and
the first electrode layer and the second electrode layer face each other across the organic electroluminescent layer.

2. The organic electroluminescent element according to claim 1, wherein an electric resistivity ρ of the metal is less than $1\times10^{-5}$ Ω·cm.

3. The organic electroluminescent element according to claim 1, wherein the semiconductor buffer layer has a thickness in a range of 1 nm to 500 nm, and an average light transmittance in a visible region is 30% or more.

4. The organic electroluminescent element according to claim 1, wherein a content of the metal in the semiconductor buffer layer is in a range of 0.0001% by volume to 90% by volume.

5. The organic electroluminescent element according to claim 1, wherein the semiconductor buffer layer is formed into a film by a vacuum deposition method.

6. The organic electroluminescent element according to claim 1, wherein a charge injecting/transporting layer is formed between the light emitting layer and the semiconductor buffer layer.

7. The organic electroluminescent element according to claim 1, wherein the first electrode layer is an anode and the second electrode layer is a cathode,
an electron injecting layer is formed between the light emitting layer and the semiconductor buffer layer, and
the electron injecting layer contains an alkali metal, an alkaline earth metal, an oxide of an alkali metal, an oxide of an alkaline earth metal, a fluoride of an alkali metal, or a fluoride of an alkaline earth metal.

8. The organic electroluminescent element according to claim 1, wherein the first electrode layer is a cathode and the second electrode layer is an anode.

9. An organic electroluminescent element comprising:
a substrate;
a first electrode layer formed on the substrate;
an organic electroluminescent layer which is formed on the first electrode layer, and has at least a light emitting layer;
a semiconductor buffer layer which is formed on the organic electroluminescent layer, and consists of an inorganic compound having a band gap of 2.0 eV or more and a metal; and
a second electrode layer formed on the semiconductor buffer layer,
wherein the semiconductor buffer layer consists of: a mixed semiconductor layer in which the metal is dispersed in the inorganic compound; and an inorganic layer comprising the inorganic compound,
the inorganic compound is an inorganic semiconductor compound,
the inorganic semiconductor compound is at least one kind of element selected from the group consisting of ZnTe, GaS, $Ga_2S_3$, GaP, GaSe, AlAs, AlSb, $Al_2Se_3$, BP, BAs, and HgS,
the second electrode layer contains an electrically conductive inorganic oxide, and
the first electrode layer and the second electrode layer face each other across the organic electroluminescent layer.

10. The organic electroluminescent element according to claim 9, wherein the first electrode layer is an anode and the second electrode layer is a cathode,
an electron injecting layer is formed between the light emitting layer and the semiconductor buffer layer, and
the electron injecting layer contains an alkali metal, an alkaline earth metal, an oxide of an alkali metal, an oxide of an alkaline earth metal, a fluoride of an alkali metal, or a fluoride of an alkaline earth metal.

11. The organic electroluminescent element according to claim 9, wherein the first electrode layer is a cathode and the second electrode layer is an anode.

12. An organic electroluminescent element comprising:
a substrate;
a first electrode layer formed on the substrate;
an organic electroluminescent layer which is formed on the first electrode layer, and has at least a light emitting layer;
a semiconductor buffer layer which is formed on the organic electroluminescent layer, and consists of an inorganic compound having a band gap of 2.0 eV or more and a metal; and
a second electrode layer formed on the semiconductor buffer layer,
wherein the semiconductor buffer layer consists of: a mixed semiconductor layer in which the metal is dispersed in the inorganic compound; and a metal layer comprising the metal,
the inorganic compound is an inorganic semiconductor compound,
the inorganic semiconductor compound is at least one kind of element selected from the group consisting of ZnTe, GaS, $Ga_2S_3$, GaP, GaSe, AlAs, AlSb, $Al_2Se_3$, BP, BAs, and HgS,
the second electrode layer contains an electrically conductive inorganic oxide, and
the first electrode layer and the second electrode layer face each other across the organic electroluminescent layer.

13. The organic electroluminescent element according to claim 12, wherein the first electrode layer is an anode and the second electrode layer is a cathode,
an electron injecting layer is formed between the light emitting layer and the semiconductor buffer layer, and
the electron injecting layer contains an alkali metal, an alkaline earth metal, an oxide of an alkali metal, an oxide of an alkaline earth metal, a fluoride of an alkali metal, or a fluoride of an alkaline earth metal.

14. The organic electroluminescent element according to claim 12, wherein the first electrode layer is a cathode and the second electrode layer is an anode.

* * * * *